US011871588B2

(12) United States Patent
Lee et al.

(10) Patent No.: US 11,871,588 B2
(45) Date of Patent: Jan. 9, 2024

(54) MEMORY DEVICE AND METHOD FOR MANUFACTURING THE SAME

(71) Applicant: MACRONIX INTERNATIONAL CO., LTD., Hsinchu (TW)

(72) Inventors: Feng-Min Lee, Hsinchu (TW); Erh-Kun Lai, Taichung (TW); Dai-Ying Lee, Hsinchu County (TW); Yu-Hsuan Lin, Taichung (TW); Po-Hao Tseng, Taichung (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 247 days.

(21) Appl. No.: 17/392,365

(22) Filed: Aug. 3, 2021

(65) Prior Publication Data
US 2023/0045495 A1    Feb. 9, 2023

(51) Int. Cl.
*H10B 63/00* (2023.01)
*H10B 61/00* (2023.01)
*H10N 50/01* (2023.01)
*H10N 70/00* (2023.01)

(52) U.S. Cl.
CPC ........... *H10B 63/845* (2023.02); *H10B 61/22* (2023.02); *H10B 63/34* (2023.02); *H10N 50/01* (2023.02); *H10N 70/066* (2023.02)

(58) Field of Classification Search
CPC ....... H10B 63/845; H10B 61/22; H10B 63/34
See application file for complete search history.

(56) References Cited

U.S. PATENT DOCUMENTS

| 11,152,388 B2 | 10/2021 | Smith et al. |
| 2021/0104532 A1 | 4/2021 | Pu et al. |
| 2021/0225938 A1 | 7/2021 | Fantini et al. |

FOREIGN PATENT DOCUMENTS

TW    202121659 A    6/2021

OTHER PUBLICATIONS

Fu, et al.: "A Novel Confined Nitride-Trapping Layer Device for 3D NAND Flash with Robust Retention Performances"; 2019 Symposium on VLSI Technology Digest of Technical Papers; pp. T212-T213.

*Primary Examiner* — Samuel A Gebremariam
(74) *Attorney, Agent, or Firm* — McClure, Qualey & Rodack, LLP

(57) ABSTRACT

A memory device includes a stack and a plurality of memory strings. The stack is disposed on the substrate, and the stack includes a plurality of conductive layers and a plurality of insulating layers alternately stacked. The memory strings pass through the stack along a first direction, wherein a first memory string in the memory strings includes a first conductive pillar and a second conductive pillar, a channel layer, and a memory structure. The first conductive pillar and the second conductive pillar respectively extend along the first direction and are separated from each other. The channel layer is disposed between the first conductive pillar and the second conductive pillar. The memory structure surrounds the second conductive pillar, and the memory structure includes a resistive memory material.

10 Claims, 31 Drawing Sheets

MEMORY DEVICE AND METHOD FOR MANUFACTURING THE SAME

BACKGROUND OF THE INVENTION

Field of the Invention

The invention relates in general to a memory device, and more particularly to a three-dimensional memory device.

Description of the Related Art

Recently, as the demand for more excellent memory devices has gradually increased, various three-dimensional (3D) memory devices have been provided. However, most of the three-dimensional memory devices still have some electrical problems. Therefore, there is still a need to provide an improved three-dimensional memory device and its manufacturing method.

SUMMARY OF THE INVENTION

The present invention relates to a memory device and a manufacturing method thereof. In the memory device of the present invention, the contact area between the memory structure and the channel layer is smaller, so some conventional electrical problems can be overcome.

According to an embodiment of the present invention, a memory device is provided. The memory device includes a stack and a plurality of memory strings. The stack is disposed on the substrate, and the stack includes a plurality of conductive layers and a plurality of insulating layers alternately stacked. The memory strings pass through the stack along a first direction, wherein a first memory string in the memory strings includes a first conductive pillar and a second conductive pillar, a channel layer, and a memory structure. The first conductive pillar and the second conductive pillar respectively extend along the first direction and are separated from each other. The channel layer is disposed between the first conductive pillar and the second conductive pillar. The memory structure surrounds the second conductive pillar, and the memory structure includes a resistive memory material.

According to a further embodiment of the present invention, a method for manufacturing the memory device is provided. The method includes the following steps. Firstly, a stacked structure disposed on a substrate is provided. The stacked structure includes a plurality of sacrificial layers and a plurality of insulating layers alternately stacked along a first direction. Then, a plurality of openings are formed passing through the stacked structure; portions of the sacrificial layers are removed to form a plurality of grooves between the sacrificial layers, the insulating layers and the openings; a channel material layer is formed in the grooves, wherein the channel material layer includes a first side and a second side, the first side and the second side are opposite to each other, a vertical hole extending along the first direction is formed on the first side of the channel material layer; a conductive material is filled in the vertical hole to form a first conductive pillar; an extension hole extending along the first direction is formed on the second side of the channel material layer, and the channel material layer becomes a channel layer; a memory material and a conductive material are sequentially filled in the extension hole to form a memory structure and a second conductive pillar, respectively, wherein the memory structure surrounds the second conductive pillar and includes a resistive memory material. After that, the sacrificial layers are removed, and a conductive material is filled at positions where the sacrificial layers are removed, to form a plurality of conductive layers.

The above and other aspects of the invention will become better understood with regard to the following detailed description of the preferred but non-limiting embodiment(s). The following description is made with reference to the accompanying drawings.

DETAILED DESCRIPTION OF THE INVENTION

The present invention relates to a three-dimensional memory device. In particular, the memory device (such as memory devices 10 and 20) according to any embodiment of the present invention can be applied to a three-dimensional "resistive memory device". In the present invention, "resistive memory device" means any memory related to changes in resistance, such as transition metal oxide resistive random-access memory (TMO ReRAM), Conductive Bridging Random Access Memory (CBRAM), Phase Change Memory (PCM), Magnetoresistive Random Access Memory (MRAM) or other suitable resistive memory. In addition, the memory device (such as the memory devices 10 and 20) according to any embodiment of the present invention can be applied to 3D AND memory, but the present invention is not limited thereto.

FIGS. 1-9D illustrate a memory device 10 and a manufacturing process for the memory device 10 according to an embodiment of the present invention.

Figure 1:
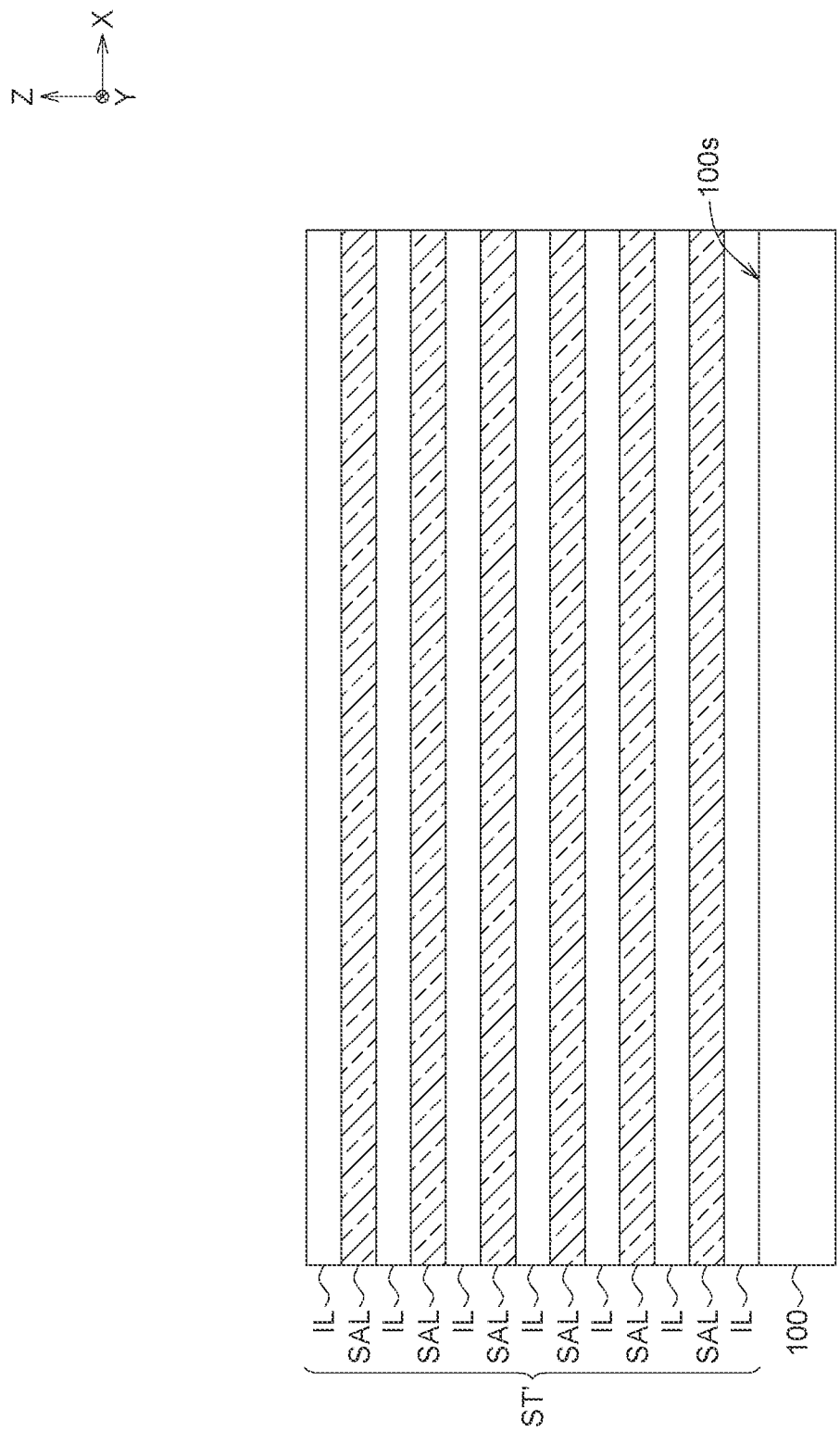
FIGS. 1-9D illustrate a memory device and a manufacturing process for the memory device according to an embodiment of the present invention.

Referring to FIG. 1, FIG. 1 illustrates a cross-sectional view formed in a first direction (such as the Z direction) and a third direction (such as the X direction). The first direction and the third direction may be intersected with each other, for example, the first direction is perpendicular to the third direction, but the present invention is not limited thereto. First, a substrate 100 is provided, and a stacked structure ST' is formed on the upper surface 100s of the substrate 100. The stacked structure ST' includes a plurality of sacrificial layers SAL and a plurality of insulating layers IL alternately stacked along the first direction (for example, Z direction, or the normal direction of the upper surface 100s of the substrate 100).

In some embodiments, the substrate 100 is, for example, a dielectric layer (for example, a silicon oxide layer). The insulating layers IL may be silicon oxide layers, for example, and the silicon oxide layers may include silicon dioxide, for example. The sacrificial layers SAL may be, for example, a silicon nitride layers. In the present embodiment, the top and bottom layers of the stacked structure ST' are the insulating layers IL, and seven insulating layers IL and six sacrificial layers SAL are shown, but the invention is not limited thereto. The number and arrangement of the insulating layers IL and the sacrificial layers SAL can be adjusted according to requirements.

Figure 2A:
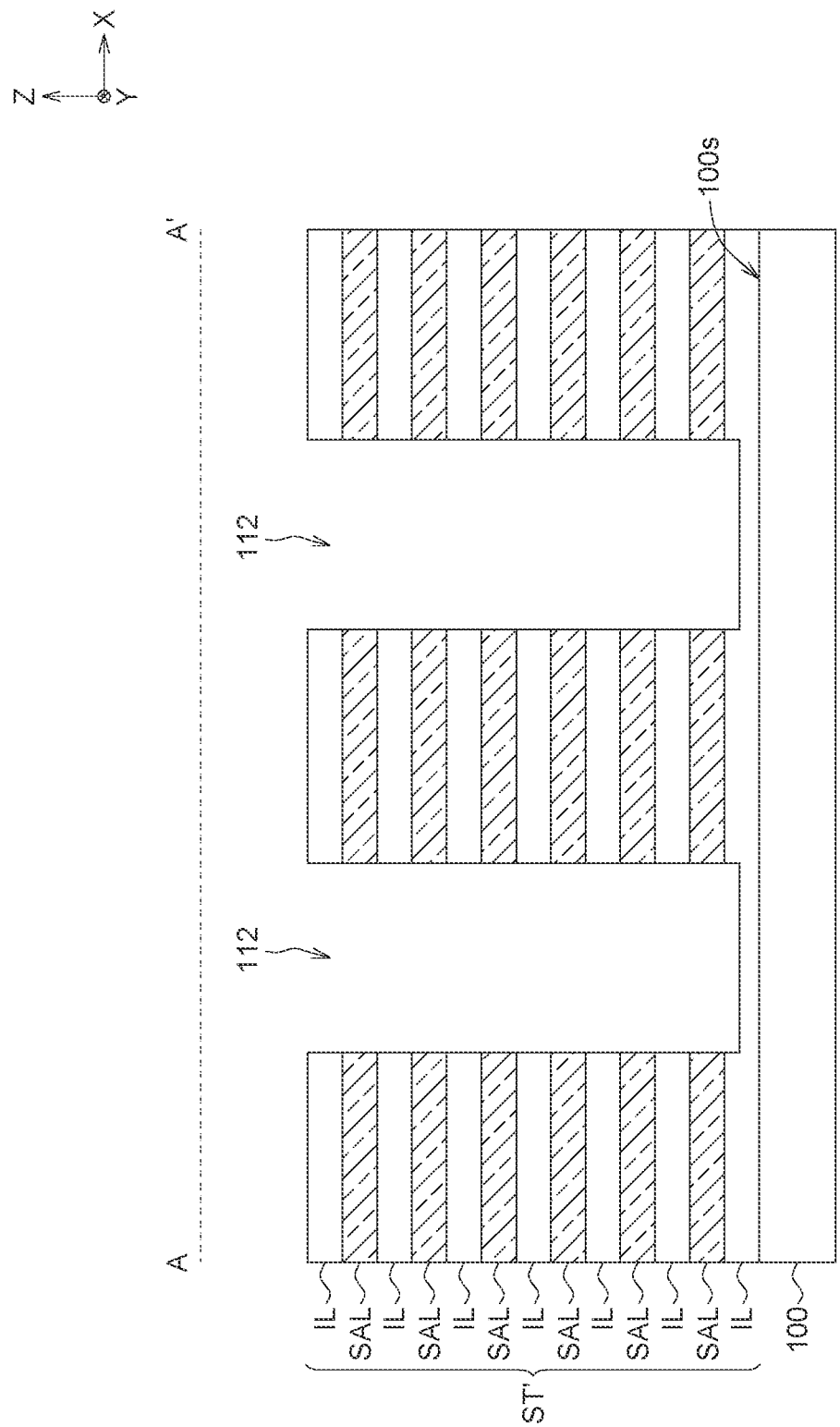
Figure 2B:
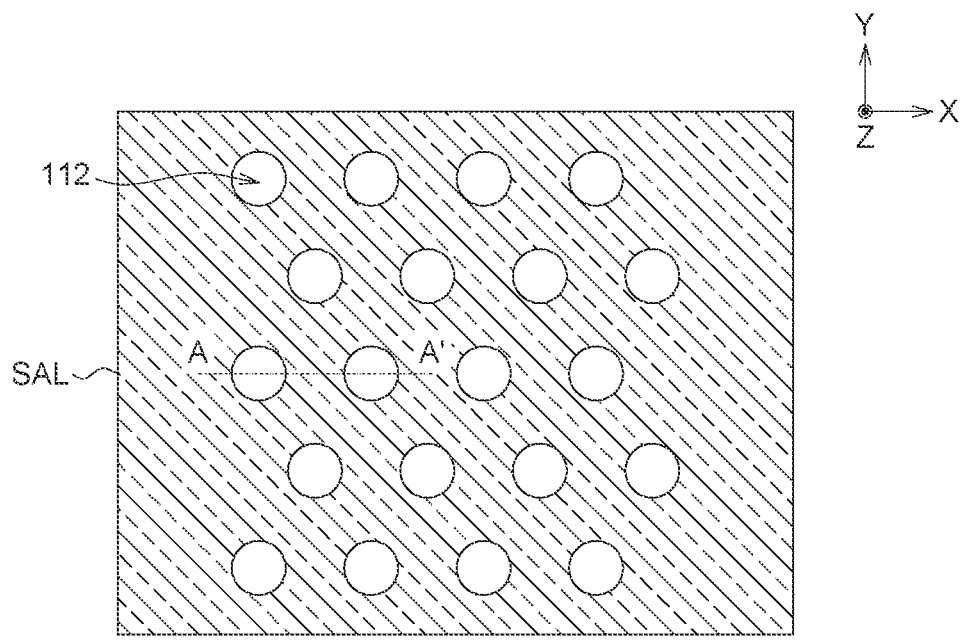
Figure 2C:
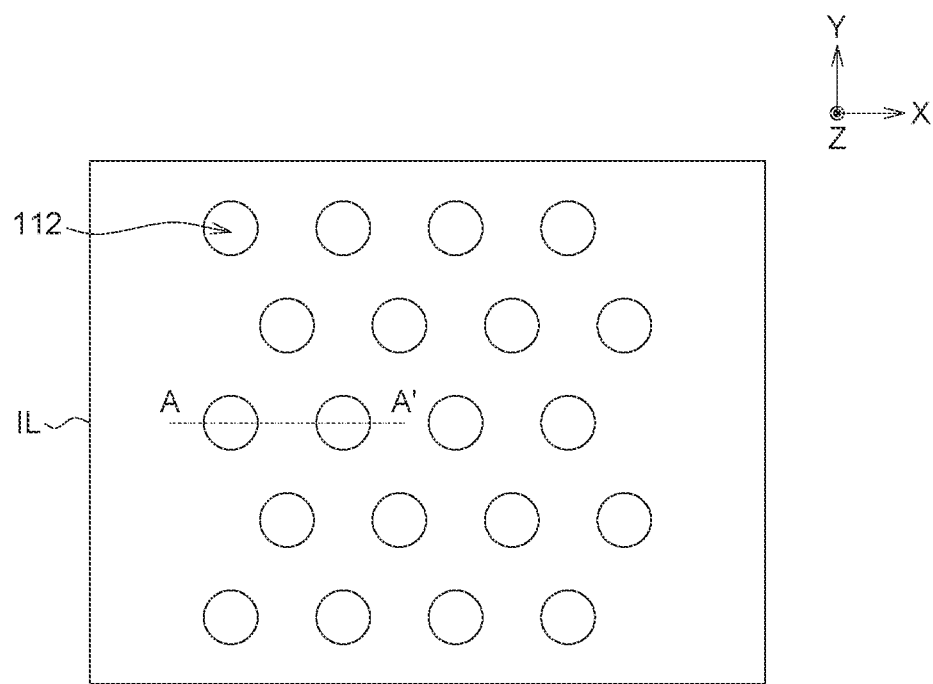

Hereafter, please refer to FIGS. 2A-2C at the same time. FIG. 2A illustrates a cross-sectional view formed in the first direction (such as Z direction) and a third direction (such as X direction), corresponding to the cross-sectional view taken along lines A-A' in FIGS. 2B and 2C; FIG. 2B illustrates a top view formed in the second direction (such as Y direction) and the third direction (such as X direction), corresponding to the plane of the sacrificial layers SAL; FIG. 2C illustrates a top view formed in the second direction (such as Y direction) and the third direction (such as X direction), corresponding to the plane of the insulating layers IL. Wherein, the first direction, the second direction, and the third direction may be intersected with each other, for example, the first direction, the second direction and the third direction are perpendicular to each other, but the present invention is not limited thereto.

As shown in FIGS. 2A to 2C, a plurality of openings 112 penetrating the stacked structure ST' along the first direction (such as Z direction) are formed in an etching process. Each of the openings 112 penetrates a portion of the bottommost insulating layer IL, and the bottom of the opening 112 may expose the bottommost insulating layer IL. In the present embodiment, the opening 112 has a round cross-section in the top views of FIGS. 2B and 2C, but the present invention is not limited thereto. The cross-sections of the openings 112 in the top views of FIGS. 2B and 2C may be elliptical or other suitable geometric shapes. In some embodiments, the openings 112 may be referred to as vertical channel openings.

Figure 3A:
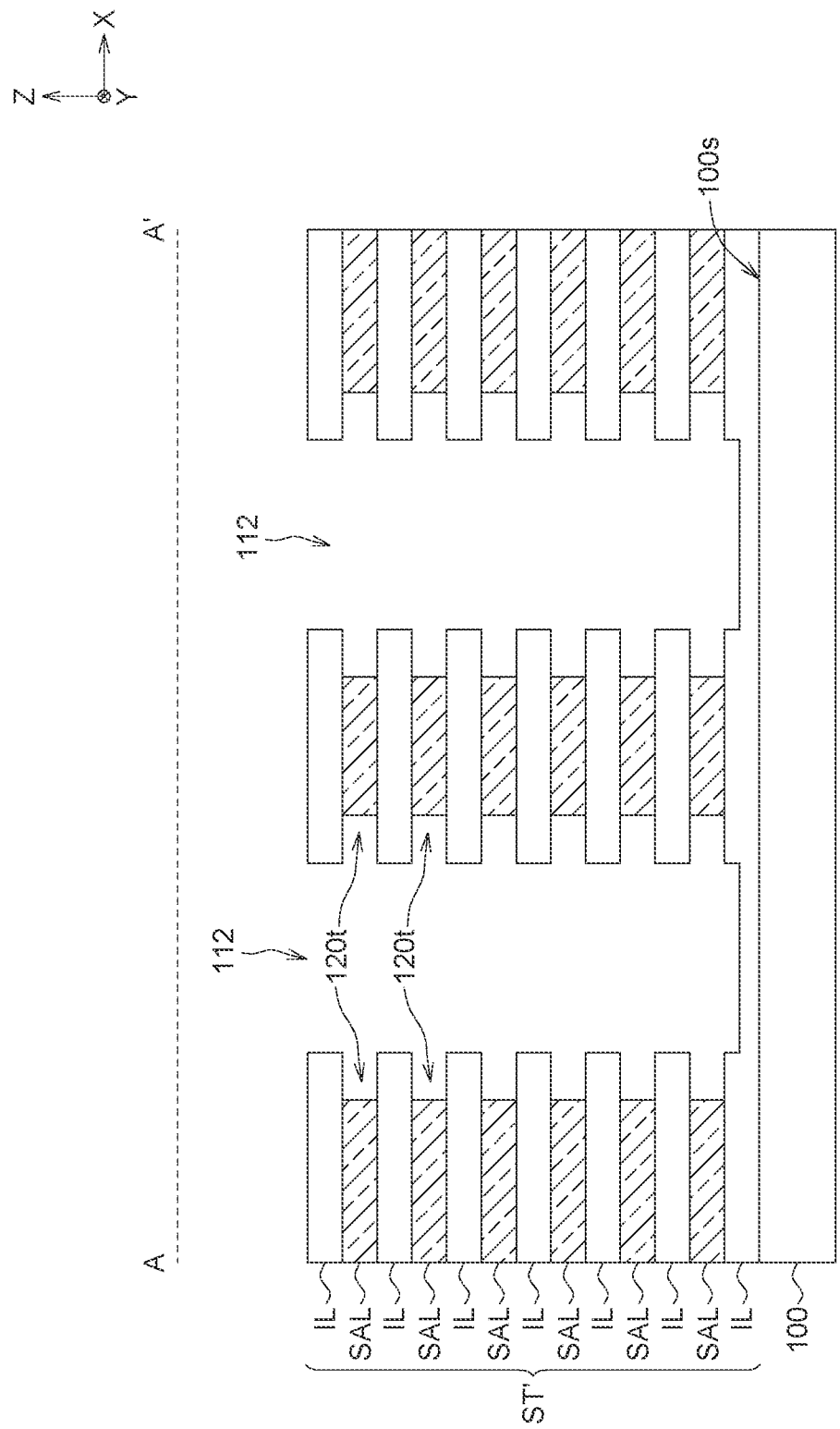
Figure 3B:
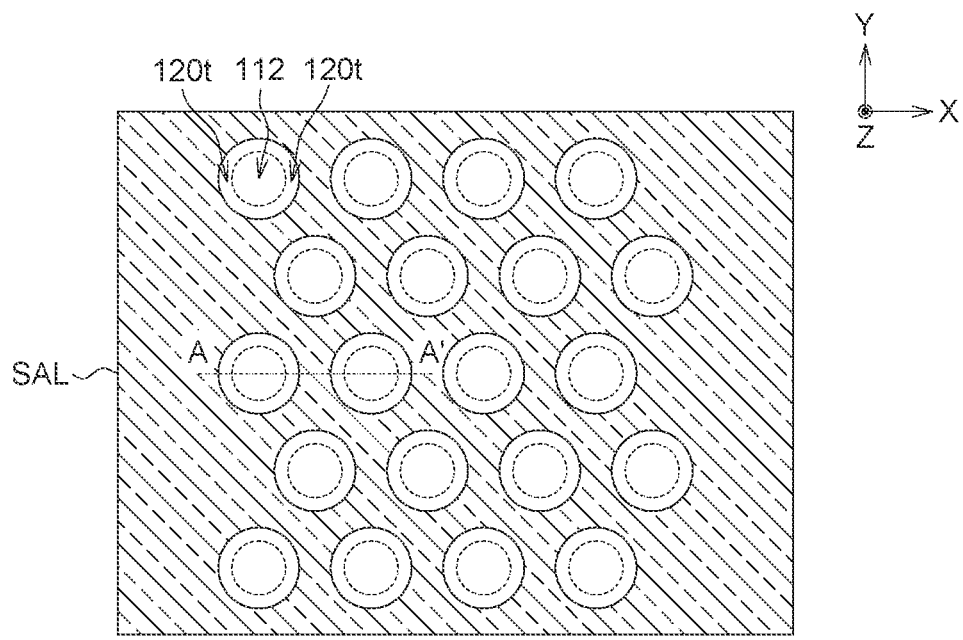
Figure 3C:
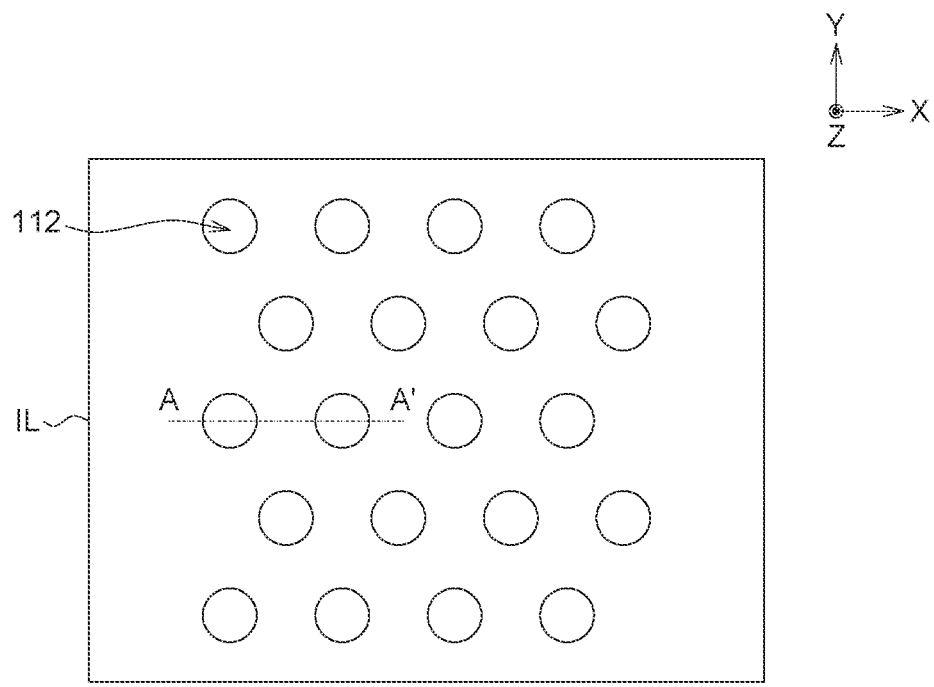

Next, please refer to FIGS. 3A to 3C at the same time. FIG. 3A shows a cross-sectional view formed in the first direction (such as Z direction) and a third direction (such as X direction), corresponding to the cross-sectional view taken along lines A-A' in FIGS. 3B and 3C; and FIG. 3B illustrates a top view formed in the second direction (such as Y direction) and the third direction (such as X direction), corresponding to the plane of the sacrificial layers SAL; FIG. 3C illustrates a top view formed in the second direction (such as Y direction) and third direction (such as X direction), corresponding to the plane of the insulating layers IL.

As shown in FIGS. 3A to 3C, portions of the sacrificial layers SAL are removed by an etching process to form a plurality of grooves 120t between the sacrificial layers SAL, the insulating layers IL and the openings 112. The grooves 120t and the openings 112 may communicate with each other. The etching process in this step is, for example, a wet etching process or a dry etching process. The etchant of the wet etching process is phosphoric acid ($H_3PO_4$), for example, and the dry etching process is Reactive-Ion Etching, for example.

Figure 4A:
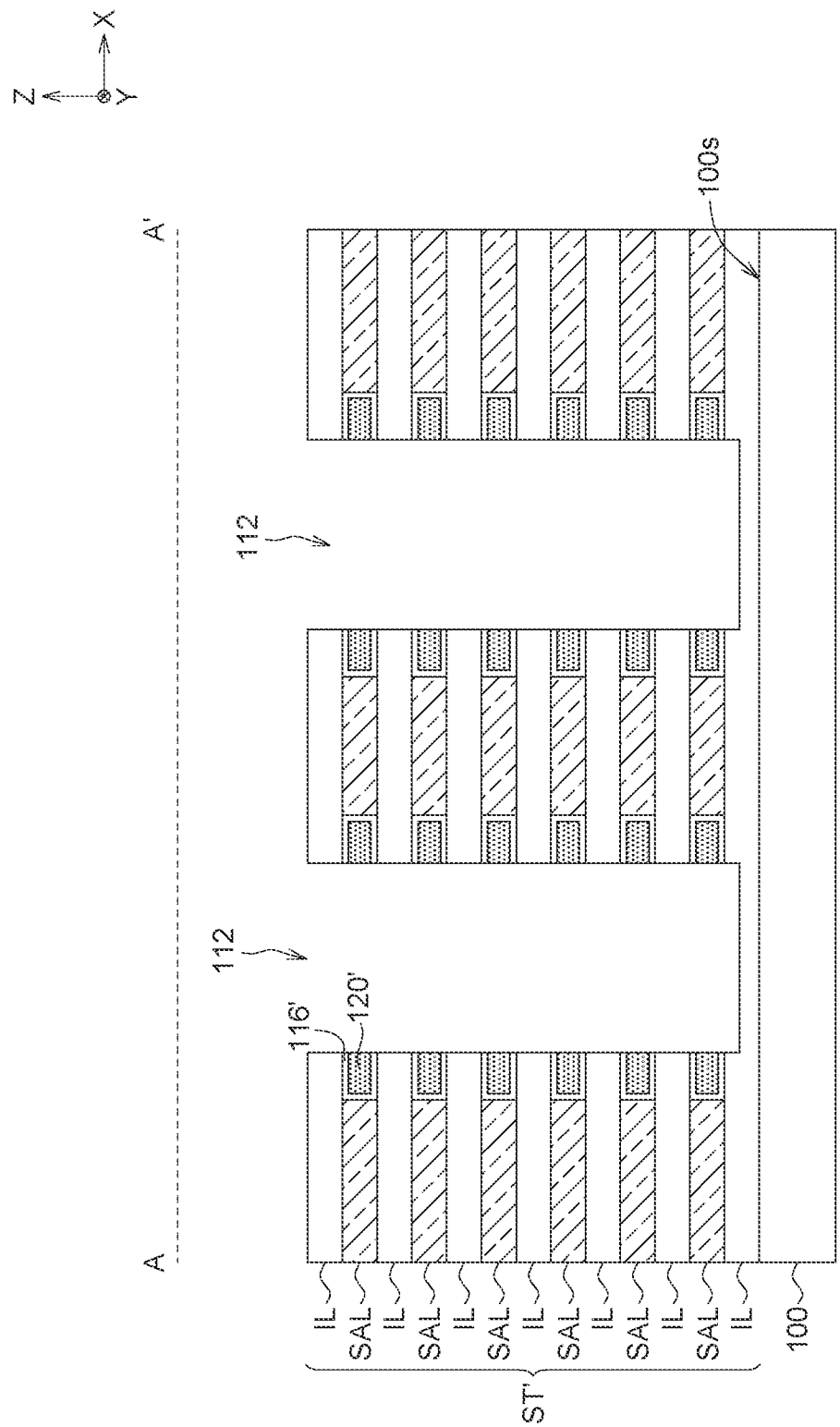
Figure 4B:
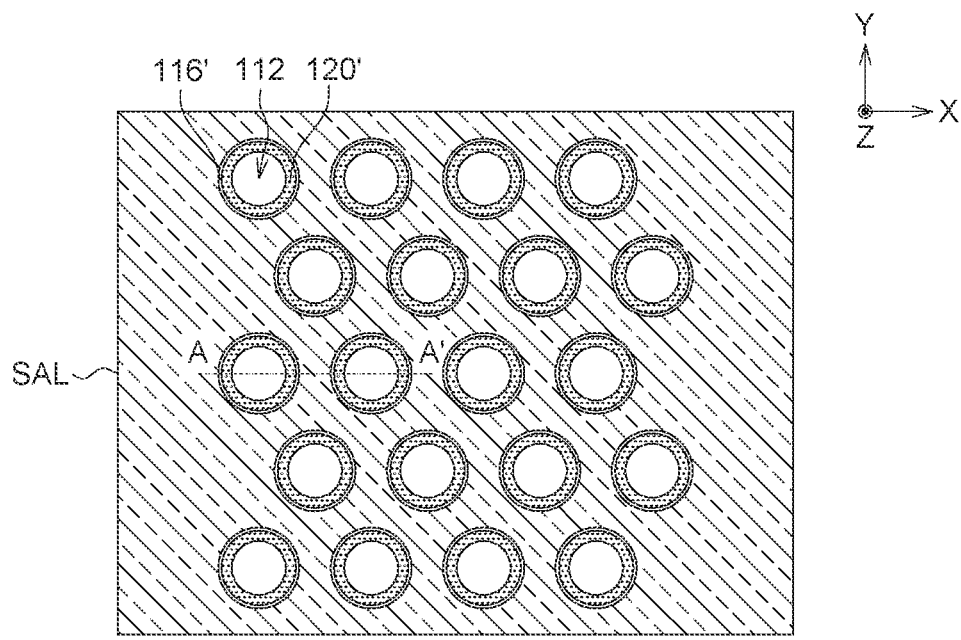
Figure 4C:
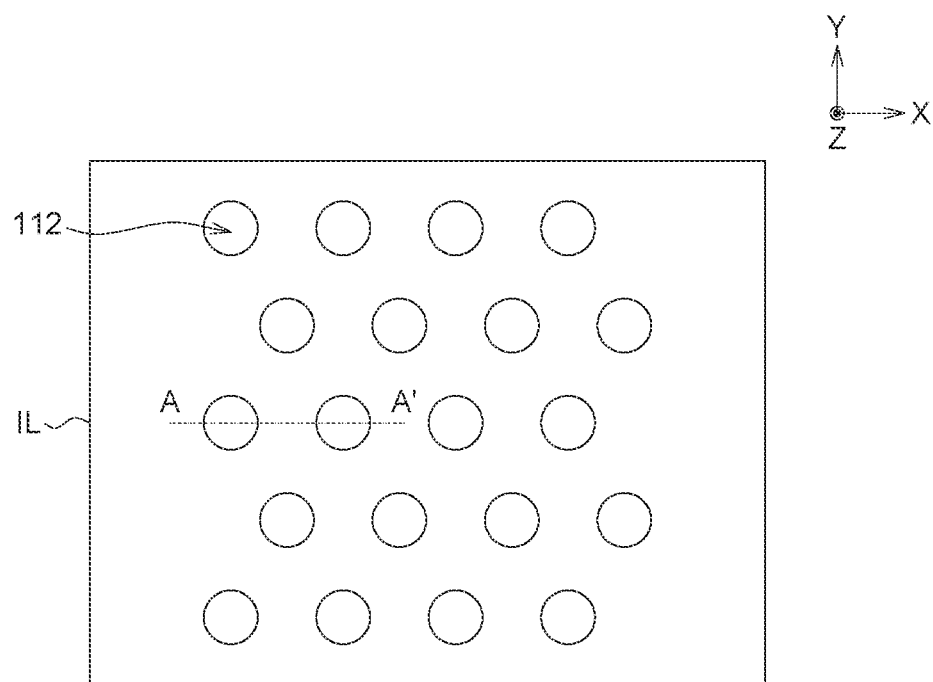

Hereafter, please refer to FIGS. 4A to 4C at the same time. FIG. 4A illustrates a cross-sectional view formed in the first direction (such as Z direction) and the third direction (such as X direction), corresponding to the cross-sectional view taken along lines A-A' in FIGS. 4B and 4C; FIG. 4B illustrates a top view formed in the second direction (such as Y direction) and the third direction (such as X direction), corresponding to the plane of the sacrificial layers SAL; FIG. 4C illustrates a top view formed in the second direction (such as Y direction) and the third direction (such as X direction), corresponding to the plane of the insulating layers IL.

As shown in FIGS. 4A to 4C, oxide material layers 116' and channel material layers 120' may be sequentially formed in the grooves 120t. The oxide material layers 116' may be formed by an oxidation process, such as in-situ steam generation oxidation (ISSG oxidation). The material of the oxide material layer 116' is, for example, silicon oxide, high dielectric constant material or other suitable materials. After the oxide material layers 116' are formed, a channel material can be filled in the openings 112 and the grooves 120t, and then the channel material in the openings 112 is removed by an etch-back process, and the channel material in the grooves 120t is retained to close the grooves 120t, so that channel material layers 120' surrounded by the oxide material layers 116' are formed. The material of the channel material layers 120' is undoped polysilicon, for example. From the perspective of FIG. 4A, the oxide material layers 116' have a C-shaped cross section, that is, the oxide material layers 116' cover the upper surface, the lower surface and one side surface of the channel material layers 120'. From the perspective of FIG. 4B, the channel material layers 120' surround the openings 112, and the oxide material layers 116' surround the channel material layers 120'. In the second and third directions, the thickness of the channel material layers 120' may be greater than the thickness of the oxide material layers 116'.

Figure 5A:
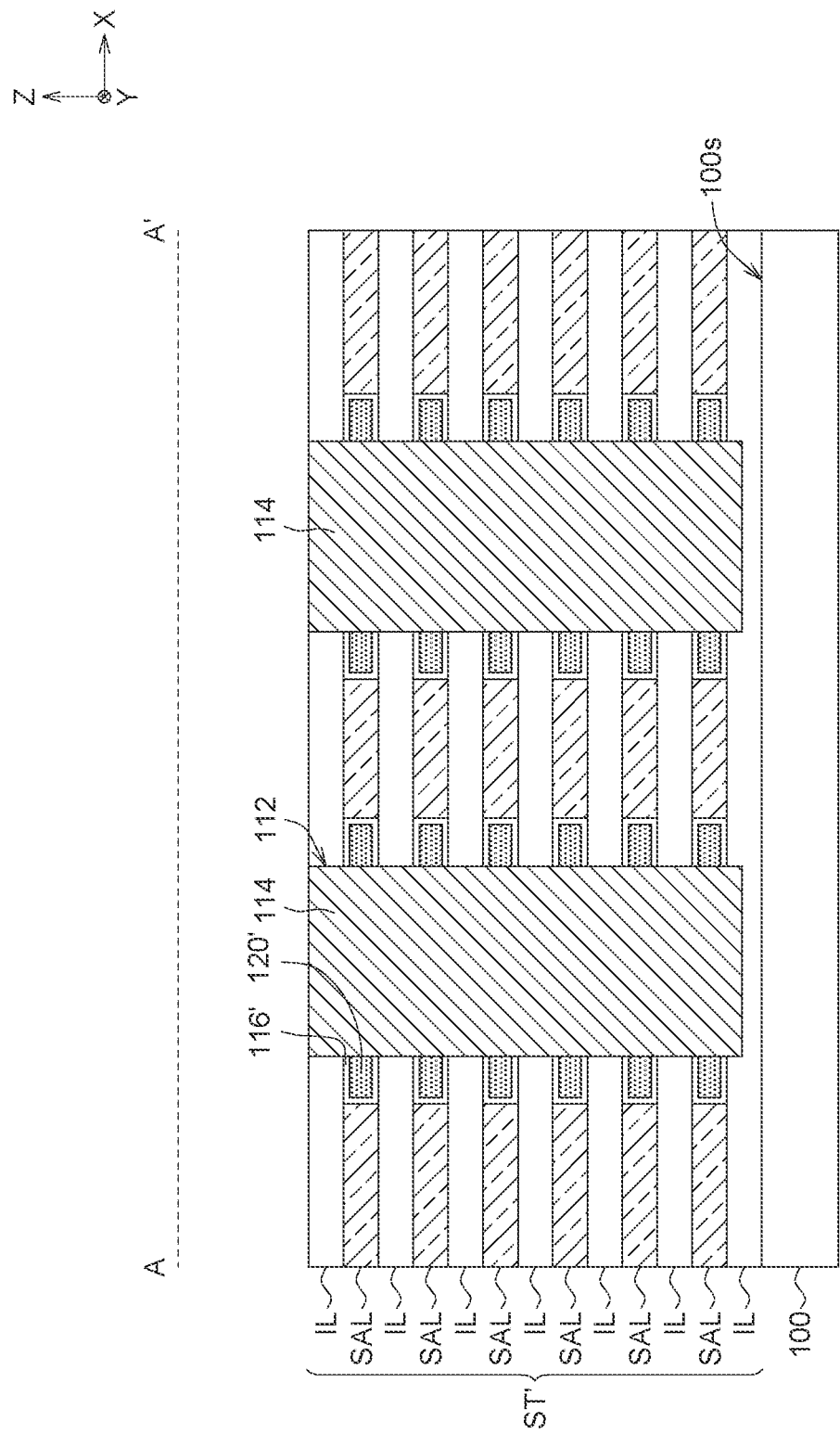
Figure 5B:
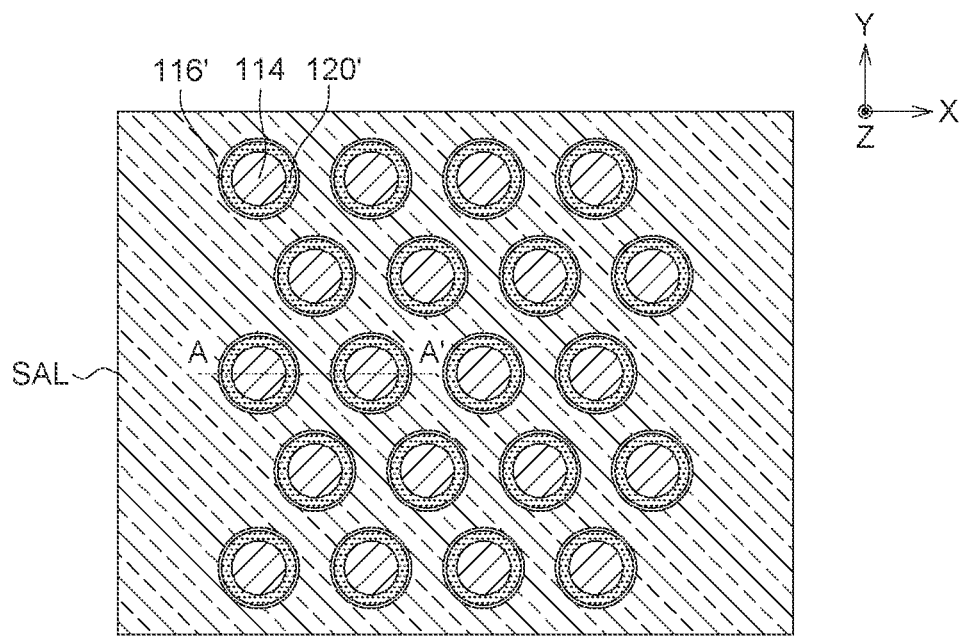
Figure 5C:
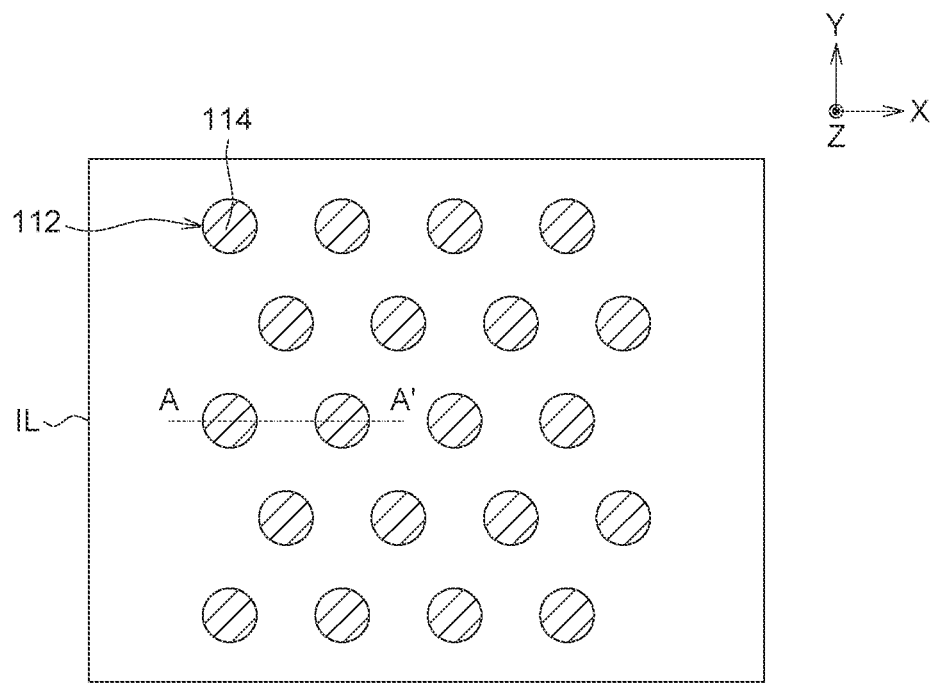

Hereafter, please refer to FIGS. 5A to 5C at the same time. FIG. 5A illustrates a cross-sectional view formed in the first direction (such as Z direction) and a third direction (such as X direction), corresponding to the cross-sectional view taken along lines A-A' in FIGS. 5B and 5C; FIG. 5B illustrates a top view formed in the second direction (such as Y direction) and the third direction (such as X direction), corresponding to the plane of the sacrificial layers SAL; FIG. 5C illustrates a top view formed in the second direction (such as Y direction) and the third direction (such as X direction), corresponding to the plane of the insulating layers IL.

As shown in FIGS. 5A to 5C, an insulating material is filled in the openings 112 to form insulating pillars 114. After that, a planarization process may be performed, for example, the planarization process is Chemical-Mechanical Planarization (CMP). The material of the insulating pillar 114 may be an oxide, such as silicon dioxide.

Figure 6A:
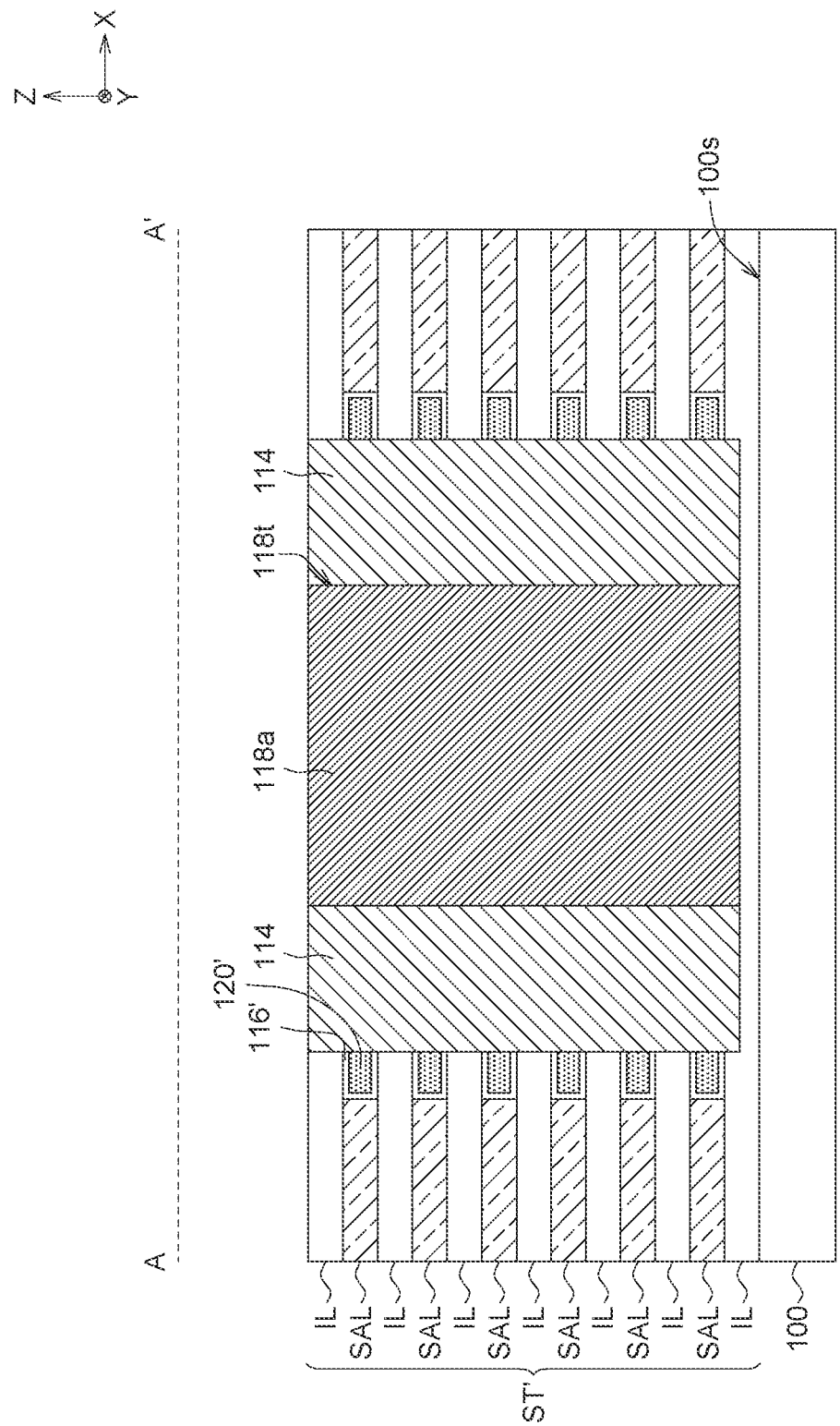
Figure 6B:
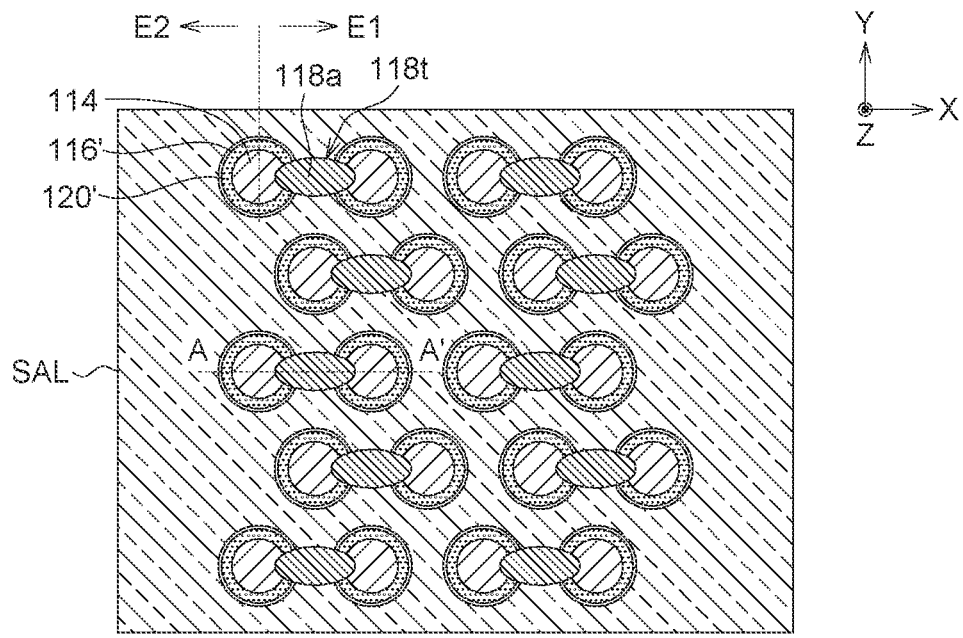
Figure 6C:
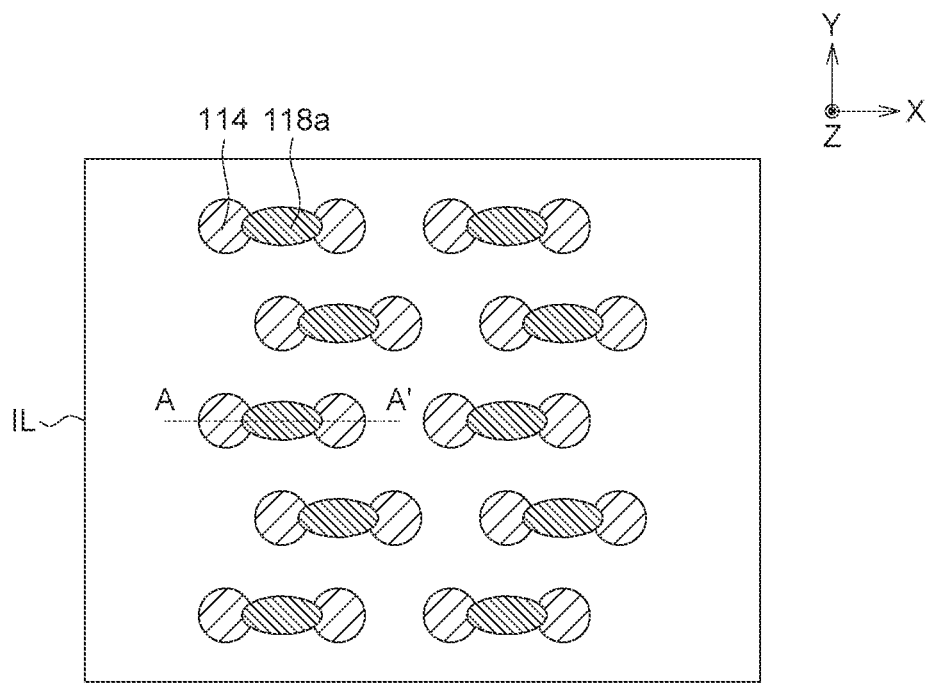

Hereafter, please refer to FIGS. 6A to 6C at the same time. FIG. 6A illustrates a cross-sectional view formed in the first direction (such as Z direction) and a third direction (such as X direction), corresponding to the cross-sectional view taken along lines A-A' in FIGS. 6B and 6C; FIG. 6B illustrates a top view formed in the second direction (such as Y direction) and the third direction (such as X direction), corresponding to the plane of the sacrificial layers SAL; FIG. 6C illustrates a top view formed in the second direction (such as Y direction) and the third direction (such as X direction), corresponding to the plane of the insulating layers IL.

As shown in FIGS. 6A to 6C, two neighboring channel material layers 120' are regarded as a group of channel material layers 120', each of the channel material layers 120' includes a first side E1 and a second side E2, and the first side E1 and the second side E2 are opposite to each other, and the first side E1 is closer to another channel material layer 120' than the second side E2. In the present embodiment, the first side E1 is, for example, the inner side of each of the channel material layers 120' in the group of channel material layers 120', and the second side E2 is, for example, the outer side of each of the channel material layers 120' in the group of channel material layers 120'. After vertical holes 118t extending along the first direction are formed on the first side E1 of the channel material layer 120', the vertical holes 118t are filled with conductive material by a deposition process to form the first conductive pillars 118a, wherein the conductive material is, for example, doped polysilicon. That is, the vertical holes 118t are formed between two neighboring insulating pillars 114, and portions of the insulating pillars 114, the channel material layers 120', the insulating layers IL and the sacrificial layers SAL (i.e. the stacked structure ST') are removed by, for example, an etching process. Afterwards, a planarization process can be performed, for example, chemical mechanical planarization. The shape and size of the vertical holes 118t are not particularly limited, as long as it is sufficient to connect two neighboring channel material layers 120'. In some embodiments, the first side E1 may be referred to as the source side, and the second side E2 may be referred to as the drain side.

Figure 7A:
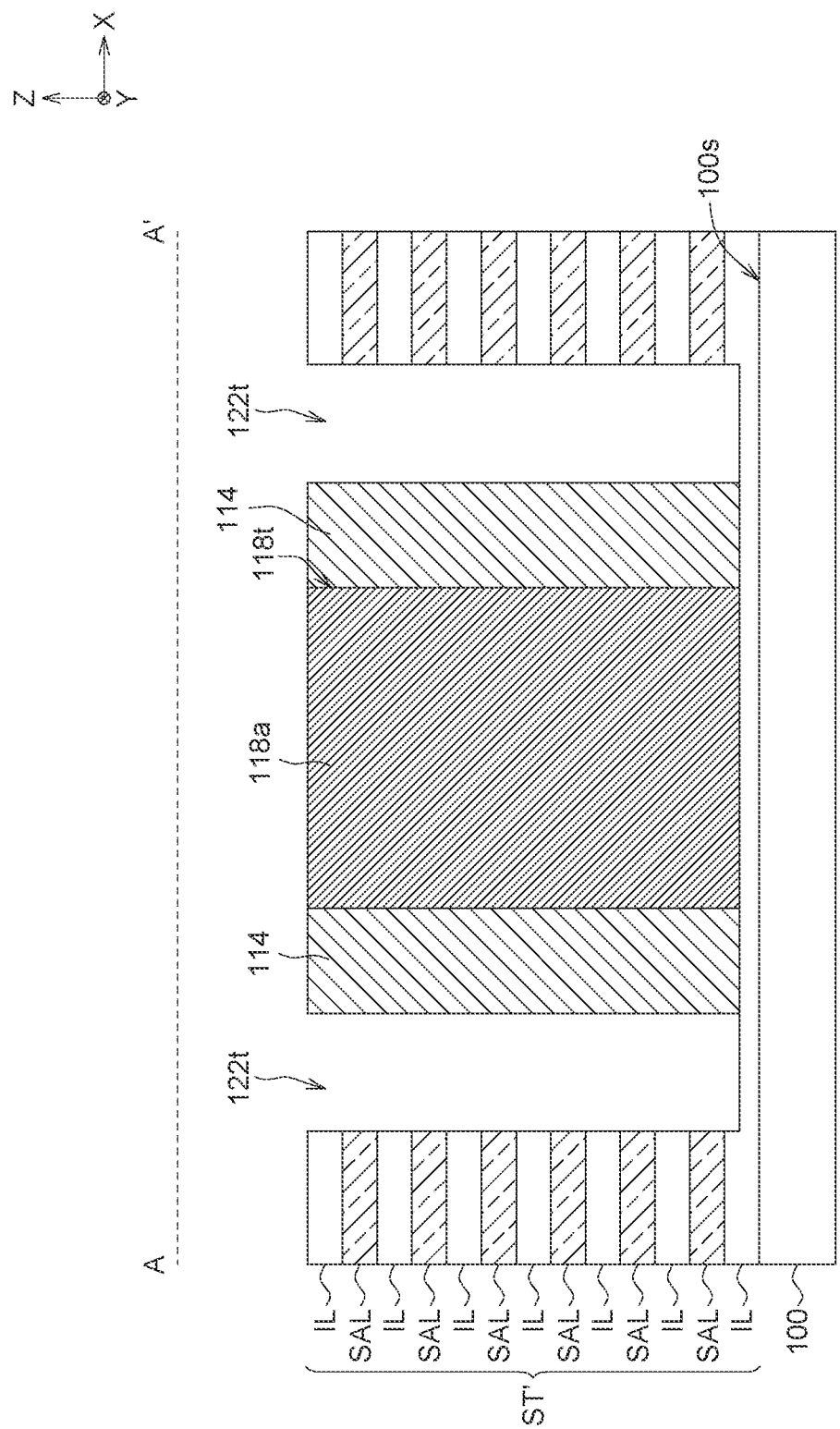
Figure 7B:
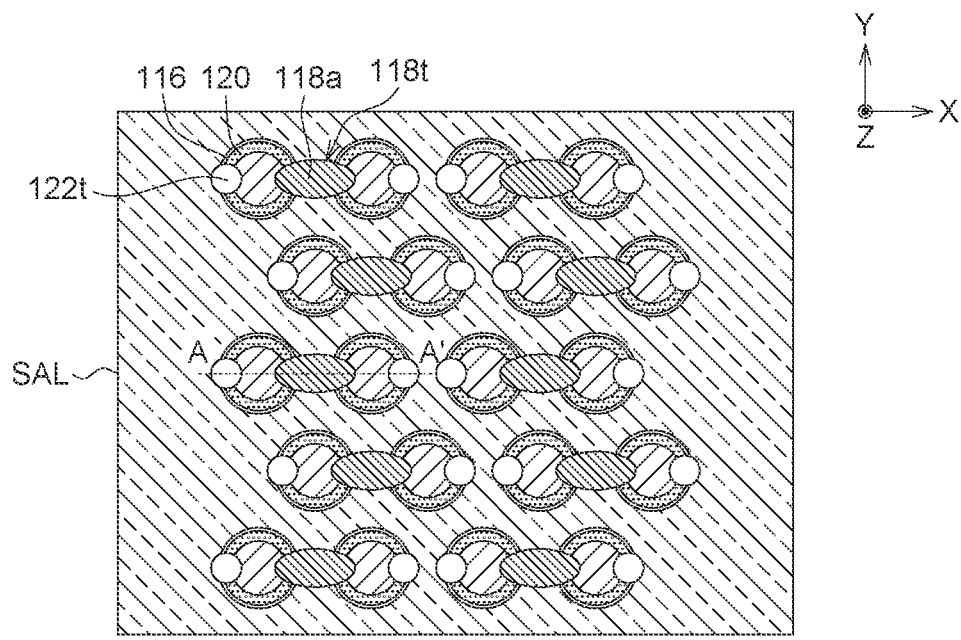
Figure 7C:
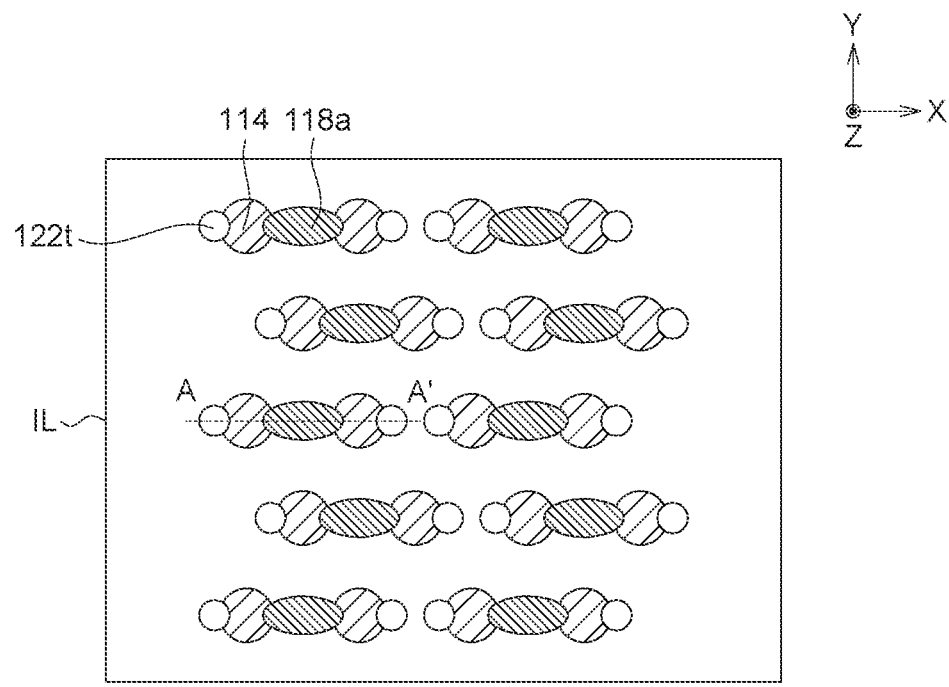

Hereafter, please refer to FIGS. 7A-7C at the same time. FIG. 7A illustrates a cross-sectional view formed in the first direction (such as Z direction) and the third direction (such as X direction), corresponding to the cross-sectional view taken along lines A-A' in FIGS. 7B and 7C; FIG. 7B illustrates a top view formed in the second direction (such as Y direction) and the third direction (such as X direction), corresponding to the plane of the sacrificial layers SAL; FIG. 7C illustrates a top view formed in the second direction (such as Y direction) and the third direction (such as X direction), corresponding to the plane of the insulating layers IL.

As shown in FIGS. 7A to 7C, extension holes 122t extending along the first direction are formed on the second side E2 (for example, the outer side) of the channel material layers 120'. The extension holes 122t are formed, for example, by an etching process which removes portions of the insulating pillars 114, the oxide material layers 116', the channel material layers 120', the insulating layers IL, and the sacrificial layers SAL (that is, removing portions of the stacked structure ST'). After the extension holes 122t are formed, the oxide material layers 116' and the channel material layers 120' become the oxide layers 116 and the channel layers 120, respectively. In the present embodiment, a width of the vertical holes 118t in the third direction (X direction) may be greater than a width of the extension holes 122t in the third direction (X direction), but the present invention is not limited thereto.

Figure 8A:
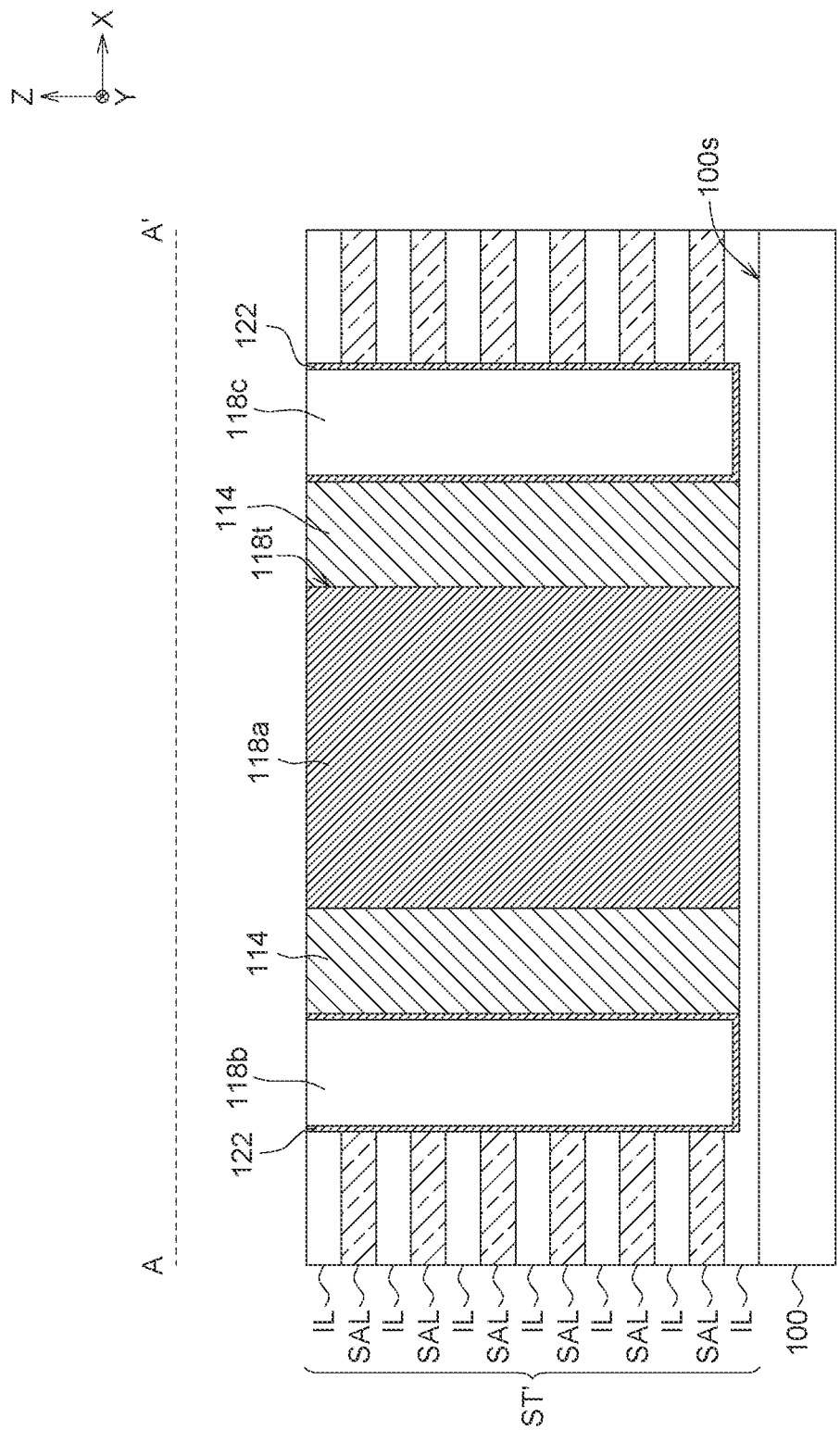
Figure 8B:
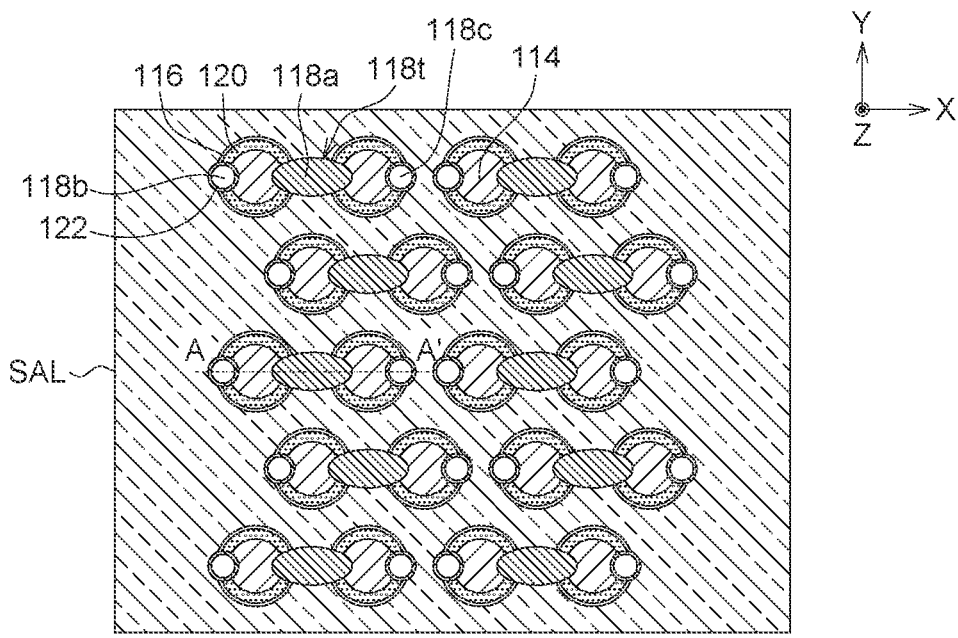
Figure 8C:
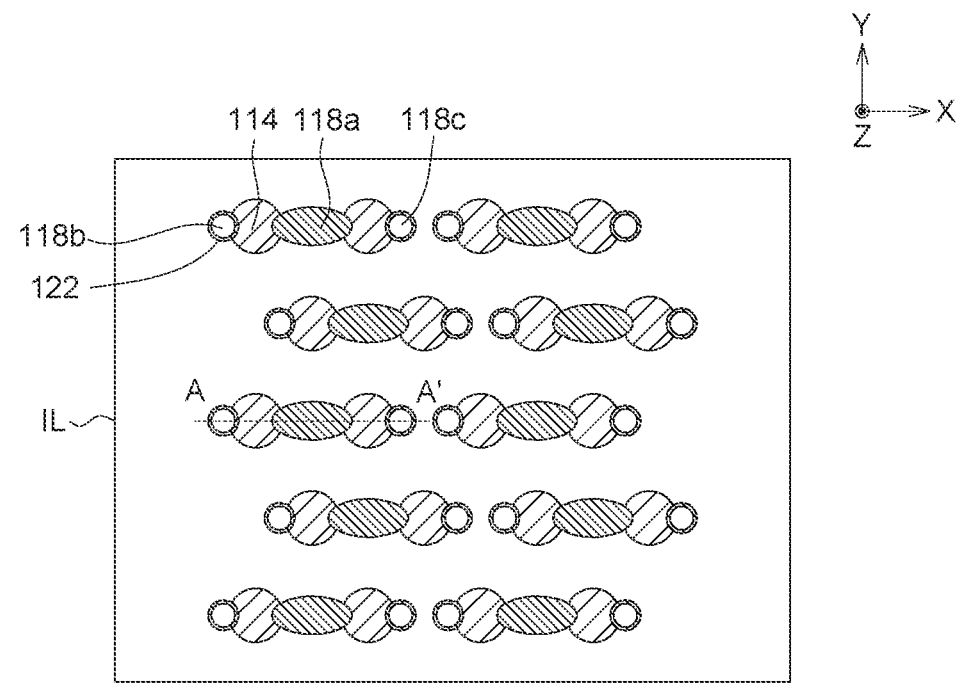

Hereafter, please refer to FIGS. 8A to 8C at the same time. FIG. 8A illustrates a cross-sectional view formed in the first direction (such as Z direction) and the third direction (such as X direction), corresponding to the cross-sectional view taken along lines A-A' in FIGS. 8B and 8C; FIG. 8B illustrates a top view formed in the second direction (such as Y direction) and the third direction (such as X direction), corresponding to the plane of the sacrificial layers SAL; FIG. 8C illustrates a top view formed in the second direction (such as Y direction) and the third direction (such as X direction), corresponding to the plane of the insulating layers IL.

As shown in FIGS. 8A to 8C, the memory material and conductive material are sequentially filled in the extension holes 122t by a deposition process to form second conductive pillars 118b, third conductive pillars 118c, and memory structures 122 surrounding the second conductive pillars 118b and the third conductive pillars 118c, respectively. Afterwards, a planarization process can be performed, for example, chemical mechanical planarization. The memory material may include resistive memory materials, such as transition metal oxides, conductive bridge memory materials, phase change memory materials, magnetoresistive memory materials, or other suitable materials. For example, the memory material may be hafnium oxide (HfO$_x$), germanium-antimony-tellurium alloy (Ge—Sb—Te alloy) or other suitable materials. The second conductive pillars 118b and the third conductive pillars 118c may have a multilayer structure, such as titanium nitride/tungsten (TiN/W), tantalum nitride/tungsten (TaN/W), titanium/titanium nitride/tungsten (Ti/TiN/W) or other suitable structure.

In the present embodiment, the cross-sections of the memory structures 122 are U-shaped structures, as shown in FIG. 8A, but the present invention is not limited thereto. In other embodiments, the memory structures 122 may be a ring-shaped structure, that is, the memory structures 122 only extend on the sidewalls of the extension holes 122t, and do not have the bottom continuously extending along the second direction and the third direction, but expose the bottom of the extension holes 122t.

Figure 9A:
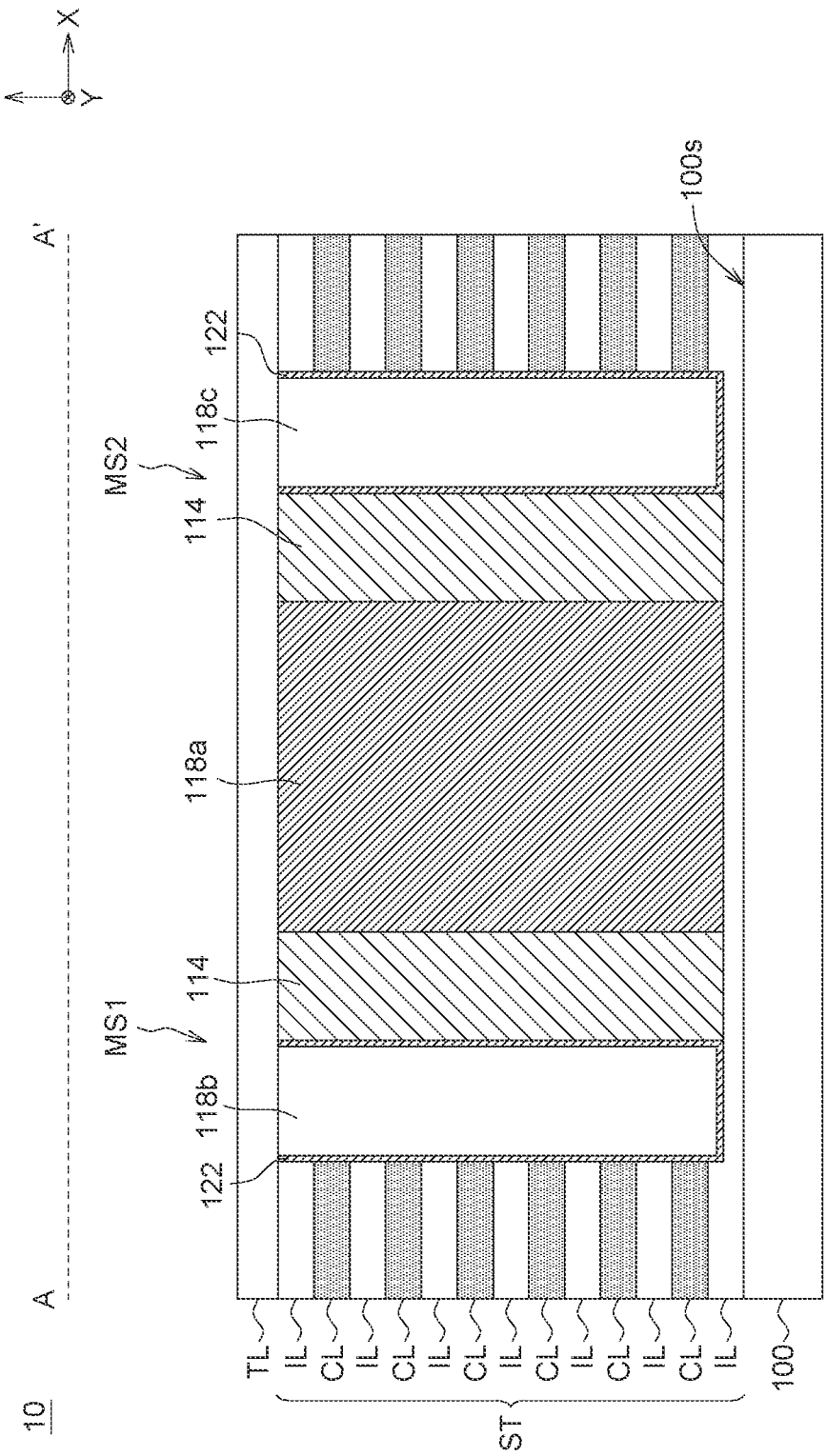
Figure 9B:
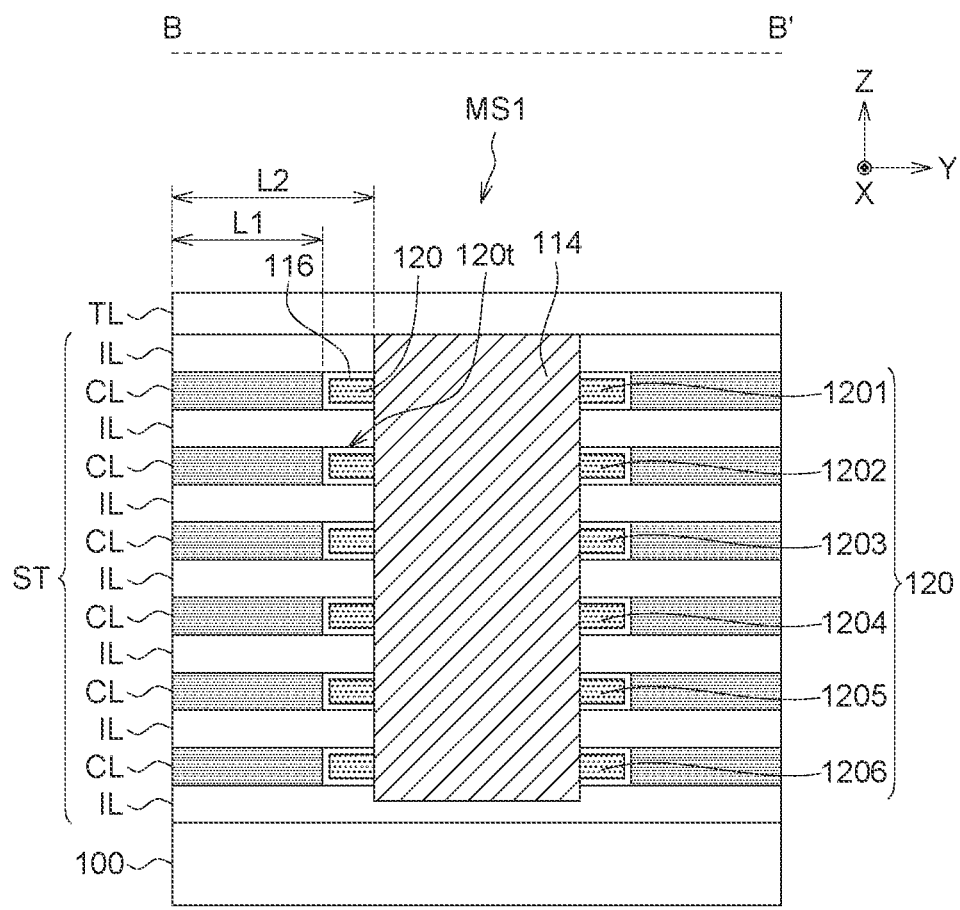
Figure 9C:
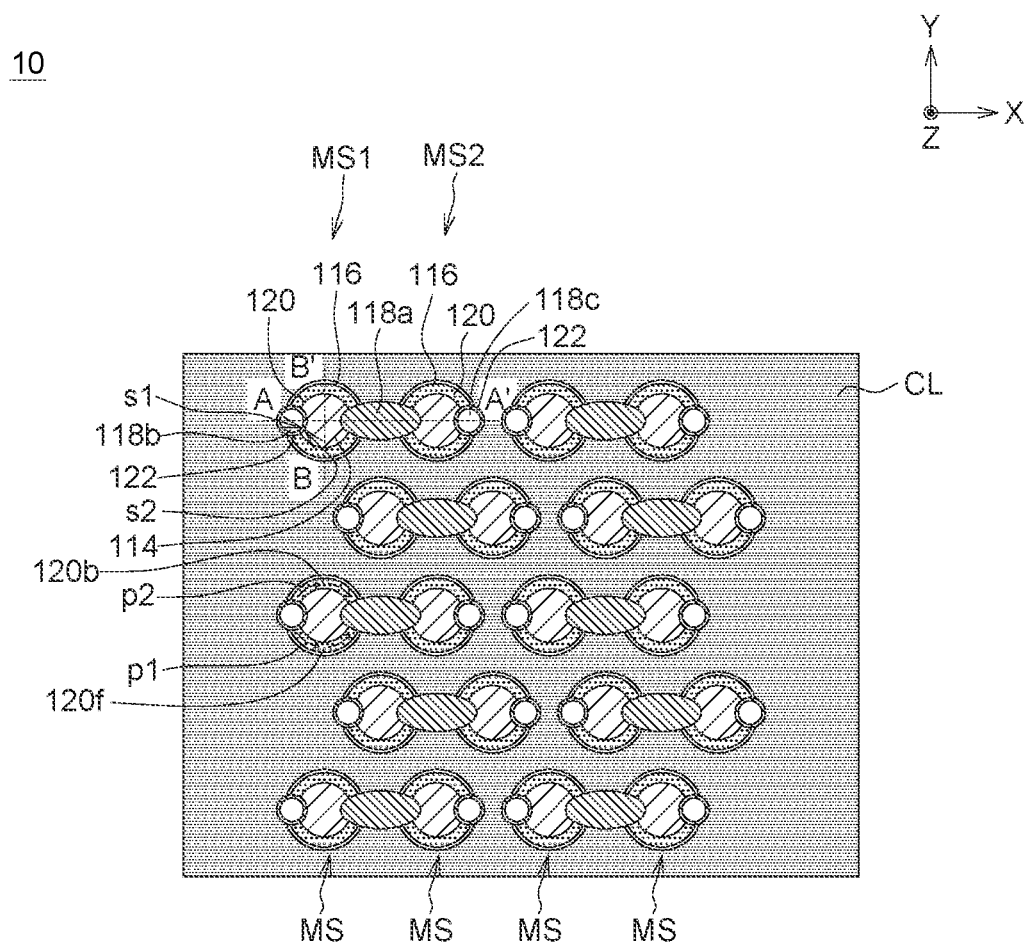
Figure 9D:
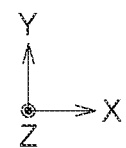
Figure 9D:

Hereafter, please refer to FIGS. 9A-9D at the same time. FIG. 9A illustrates a cross-sectional view formed in the first direction (such as Z direction) and the third direction (such as X direction); FIG. 9B illustrates a cross-sectional view formed in the first direction (such as Z direction) and the second direction (such as Y direction); FIG. 9C illustrates a top view formed in the second direction (such as Y direction) and the third direction (such as X direction), corresponding to the plane of conductive layers CL; FIG. 9D illustrates a top view formed in the second direction (such as Y direction) and the third direction (such as X direction), corresponding to the plane of the cover layer TL. FIGS. 9A and 9B respectively correspond to the cross-sections taken along line A-A' and line B-B' in FIG. 9C.

As shown in FIGS. 9A-9D, after the sacrificial layers SAL are removed, conductive materials are filled at positions where the sacrificial layers SAL are removed, to form a plurality of conductive layers CL, that is, a stack ST alternately stacked by the conductive layers CL and the insulating layers IL along the first direction is formed. Thereafter, a cover layer TL is formed on the stack ST. For example, the sacrificial layers SAL can be removed by a selective etching process, and the insulating layers IL are remained. In this way, a plurality of memory strings MS penetrating the stack ST are formed. The memory strings MS may include a first memory string MS1 and a second memory string MS2, wherein the first conductive pillar 118a, the second conductive pillar 118b, the channel layer 120 and the memory structure 122 may correspond to a first memory string MS1. In some embodiments, barrier layers (not shown) may be deposited at the positions where the sacrificial layers SAL are removed before filling the conductive material. The material of the barrier layers may be an oxide material or a dielectric material. The barrier layers can electrically isolate the conductive layers CL and the memory structures 122, and can serve as gate oxides of the channel layer 120.

According to the above steps, a memory device 10 as shown in FIGS. 9A to 9D is formed. The memory device 10 includes a stack ST, a plurality of memory strings MS, and a cover layer TL 100 disposed on a substrate. The stack ST includes a plurality of conductive layers CL and a plurality of insulating layers IL alternately stacked along the first direction. Wherein, the substrate 100 has an upper surface 100s, the stack ST is formed on the upper surface 100s, the conductive layers CL and the insulating layers IL respectively extend along a second direction and a third direction, the first direction, the second direction and the third direction are intersected with each other (the first direction, the second direction and the third direction are, for example, perpendicular to each other, but the present invention is not limited thereto). The memory strings MS pass through the stack ST along a first direction (such as Z direction). The cover layer TL is disposed on the stack ST.

Referring to FIG. 9C, two neighboring memory strings MS form a group of memory strings MS, and the two neighboring memory strings MS are connected to each other. Each group of memory strings MS may include a first memory string MS1 and a second memory string MS2. The first memory string MS1 includes a first conductive pillar 118a, a second conductive pillar 118b, an oxide layer 116, an insulating pillar 114, a channel layer 120, and a memory structure 122. The first conductive pillar 118a and the second conductive pillar 118b may extend along the first direction, respectively, and may be separated from each other, respectively. The channel layer 120 is disposed between the first conductive pillar 118a and the second conductive pillar 118b. The oxide layer 116 is disposed between the conductive layer CL and the channel layer 120. The memory structure 122 surrounds the second conductive pillar 118b, and does not surround the channel layer 120, the oxide layer 116, and the first conductive pillar 118a (i.e. the memory structure 122 exposing the channel layer 120, the oxide layer 116, and the first conductive pillar 118a). Furthermore, the memory structure 122 has an inner surface s1 and an outer surface s2. The inner surface s1 is opposite to the outer surface s2, the inner surface s1 is in direct contact with the second conductive pillar 118b, and the outer surface s2 is in direct contact with the channel layer 120, so that the second conductive pillar 118b and the channel layer 120 are separated by the memory structure 122. In other words, the memory structure 122 extends along the first direction (Z direction) and is disposed between the second conductive pillar 118b and the channel layer 120, between the second conductive pillar 118b and the insulating pillar 114, and between the second conductive pillar 118b and the stack ST (including the conductive layers CL and the insulating layers SL).

In the cross-section as shown in FIG. 9C, the channel layer 120 is divided into the front channel layer 120f and the rear channel layer 120b by the first conductive pillar 118a and the second conductive pillar 118b. The front channel layer 120f and the rear channel layer 120b provide two current paths p1 and p2. In an embodiment, the first conductive pillar 118a serves as the source of the first memory string MS1, and the second conductive pillar 118b serves as the drain of the first memory string MS1. The conductive layers CL can be used as word lines. The bit line (not shown) is electrically connected to the second conductive pillar 118b. After the current flows into the second conductive pillar 118b through the bit line (not shown), the current may flow into the memory structure 122 from the second conductive pillar 118b, and thereafter, the current may transmit to the front channel layer 120f or/and the rear channel layer 120b from the memory structure 122, and then transmits to first conductive pillar 118a from the front channel layer 120f or/and the rear channel layer 120b. That is, the current may flow through the path p1 or/and the path p2.

Please refer to FIG. 9B, a length L1 of the conductive layers CL is smaller than a length L2 of the insulating layers IL in the second direction (Y direction). In the present embodiment, a total length of the conductive layers CL, the oxide layer 116 and the channel layer 120 in the second direction equals to the length of the insulating layers IL in the second direction. A plurality of grooves 120t are disposed between the conductive layers CL, the insulating layers IL, and the insulating pillar 114, the oxide layers 116, the channel conductive layers CL, and the channel layer 120 is disposed in the grooves 120t. More specifically, each of the conductive layers CL corresponds to a groove 120t, and the channel layer 120 is disposed between the two neighboring upper and lower insulating layers IL, the insulating pillar 114, and the corresponding conductive layer CL. Further, the channel layer 120 includes a plurality of channel portions 1201 to 1206, the channel portions 1201 to 1206 correspond to different layers of conductive layers CL, and the channel portions 1201 to 1206 are separated from each other. In the present embodiment, the channel portions 1201 to 1206 in different layers are respectively confined in the grooves 120t and are not connected to each other. However, the present invention is not limited thereto. In other embodiments, the channel layer may extend to the outside of the groove, and the channel portions in different layers may be connected to each other.

According to an embodiment of the present invention, the memory structure 122 includes a resistive memory material. The resistive memory material is, for example, transition metal oxide, conductive bridge memory material, phase change memory material, magnetoresistive memory material, or other suitable materials. For example, the memory material may be hafnium oxide ($HfO_X$), germanium-antimony-tellurium alloy (Ge—Sb—Te alloy) or other suitable materials. The material of the oxide layer 116 is, for example, silicon oxide, a high dielectric constant material, or other suitable materials. The material of the first conductive pillar 118a may include doped polysilicon. The second conductive pillar 118b may be a multilayer structure, such as titanium nitride/tungsten (TiN/W), tantalum nitride/tungsten (TaN/W), titanium/titanium nitride/tungsten (Ti/TiN/W), or other suitable structures. The material of the channel layer 120 is, for example, doped polysilicon. The conductive layers CL are, for example, double-layered structures of titanium nitride/tungsten (Ti/W). The material of the insulating layers IL may include an oxide, such as silicon dioxide.

In the present embodiment, the second memory string MS2 is neighboring and adjacent to the first memory string MS1, and the first memory string MS1 and the second memory string MS2 share the first conductive pillar 118a, as shown in FIG. 9C. The second memory string MS2 includes a first conductive pillar 118a, a third conductive pillar 118c, oxide layers 116, an insulating pillar 114, a channel layer 120, and a memory structure 122. The first conductive pillar 118a can be used as the common source of the first memory string MS1 and the second memory string MS2, and the second memory string MS2 is mirror-symmetrical to the first memory string MS1 on a symmetry axis penetrating the center of the first conductive pillar 118a and extending along the second direction. The third conductive pillar 118c and the second conductive pillar 118b have the same material, structure and function, and the third conductive pillar 118c can be used as the drain in the second memory string MS2, that is, after applying current to the third conductive pillar 118c, the current may be transmitted to the first conductive pillar 118a through the memory structure 122 and the channel layer 120 in sequence. Other elements in the second memory string MS2 use the same reference numerals as other elements in the first memory string MS1, and the elements also have the same material, structure and function, and the description will not be repeated here.

In the present embodiment, the first conductive pillar 118a may have an elliptical cross-section, and the second conductive pillar 118b and the third conductive pillar 118c may have a circular cross-section, as shown in FIG. 9C, but the present invention is not limited thereto. In other embodiments, the cross-section of the first conductive pillar 118a may be circular or other suitable shapes, and the cross-section of the second conductive pillar 118b and the third conductive pillar 118c may be elliptical or other suitable shapes, which can be adjusted by one of ordinary skilled in the art according to their requirements.

Compared with the comparative example in which the memory structure surrounds the channel layer, since the memory structure 122 in the present invention only surrounds the second conductive pillar 118b or the third conductive pillar 118c and does not surround the channel layer 120, the contact area between the memory structure 122 and the channel layer 120 is smaller. Moreover, compared with the comparative example in which the channel layer is not formed in the groove or the channel layer extends continuously along the first direction, the channel layer 120 according to an embodiment of the present invention is formed in the grooves 120t and the channel portions 1201 to 1206 corresponding to different layers of the conductive layers CL are not connected to each other, so the contact area between the memory structure 122 and the channel layer 120 is smaller. That is, in the memory device 10 according to one embodiment of the present application, the memory structure 122 and the channel layer 120 can have a smaller contact area, so that the risk of leakage current can be greatly reduced, and the operating voltage can be reduced.

FIGS. 10A to 13D show a memory device 20 according to a further embodiment of the present invention and the manufacturing process of the memory device 20.

Figure 10A:
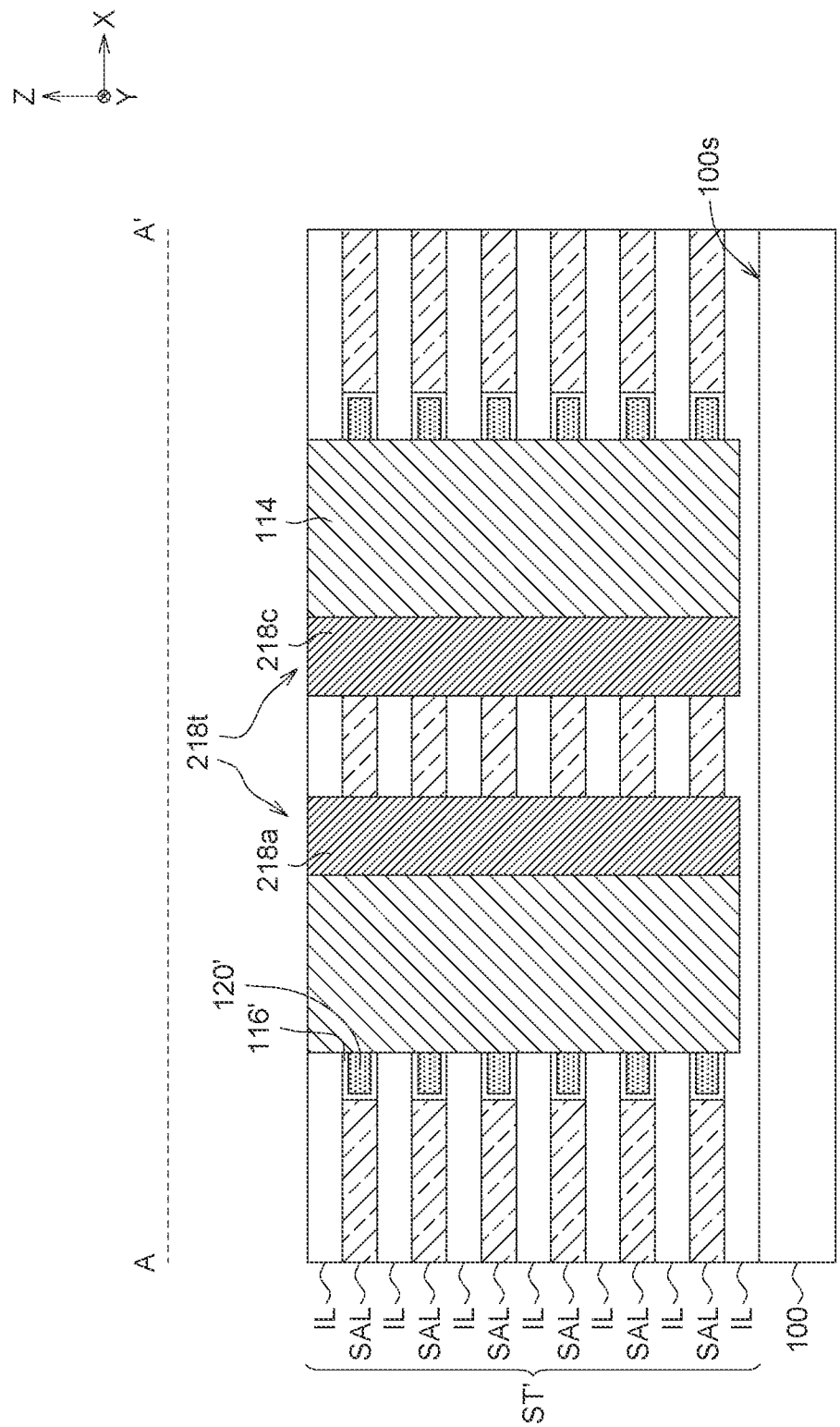
FIGS. 10A-13D illustrate a memory device and a manufacturing process for the memory device according to another embodiment of the present invention.
Figure 10B:
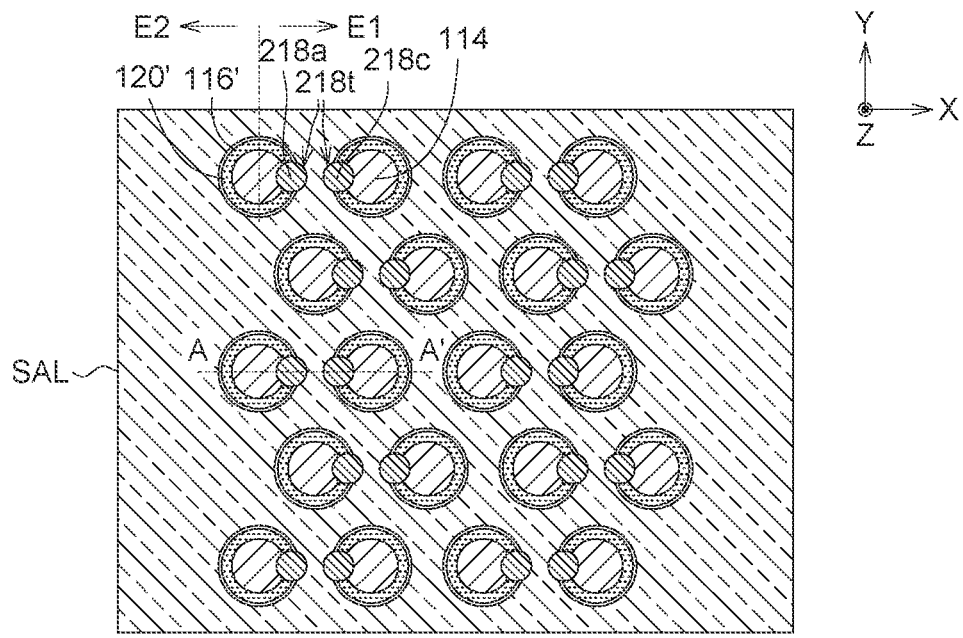
Figure 10C:
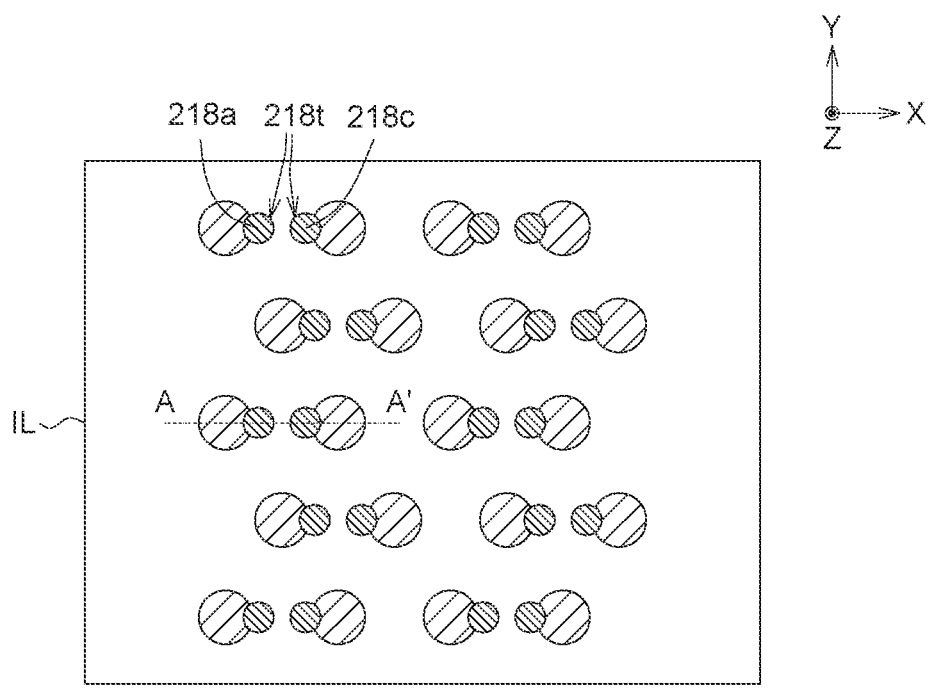

First, the forming steps shown in FIGS. 1 to 5C are performed, and thereafter, the forming steps shown in FIGS. 10A to 10C are performed. Please refer to FIGS. 10A-10C at the same time. FIG. 10A illustrates a cross-sectional view formed in the first direction (such as Z direction) and a third direction (such as X direction), corresponding to the cross-sectional view taken along lines A-A' in FIGS. 10B and 10C; FIG. 10B illustrates a top view formed in the second direction (such as Y direction) and the third direction (such as X direction), corresponding to the plane of the sacrificial layer SAL; FIG. 10C illustrates a top view formed in the second direction (such as Y direction) and the third direction (such as X direction), corresponding to the plane of the insulating layer IL.

As shown in FIGS. 10A to 10C, two neighboring channel material layers 120' along the third direction (such as X direction) are regarded as a group of channel material layers 120'. Each of the channel material layers 120' includes a first side E1 and a second side E2. The first side E1 and the second side E2 are opposite to each other, and the first side E1 is closer to another channel material layer 120' than the second side E2. In the present embodiment, the first side E1 is, for example, the inner side of each of the channel material layers 120' in a group of channel material layers 120', and the second side E2 is, for example, the outer side of each of the channel material layers 120' in a group of channel material layers 120'. After the vertical holes 218t extending along the first direction are formed on the first sides E1 of the channel material layer 120', a conductive material is filled in the vertical holes 218t by a deposition process to form the first conductive pillar 218a and the third conductive pillar 218c, wherein the conductive material is, for example, doped polysilicon. That is, two neighboring vertical holes 218t are formed between two neighboring insulating pillars 114, and for example, two neighboring vertical holes 218t are formed by an etching process to remove portions of the insulating pillars 114, the channel material layers 120', the insulating layers IL, and the sacrificial layers SAL (that is, removing portions of the stacked structure ST'). Afterwards, a planarization process can be performed, for example, chemical mechanical planarization. In some embodiments, the first side E1 may be referred to as the source side, and the second side E2 may be referred to as the drain side. As shown in FIG. 10B, the first conductive pillar 218a is disposed on the right side of the channel material layer 120' connected by the first conductive pillar 218a, and the third conductive pillar 218c is disposed on the left side of the channel material layer 120' connected by the third conductive pillar 218c, that is, the first conductive pillar 218a and the third conductive pillar 218a are respectively disposed on different sides of the connected channel material layers 120' (for example, the left side and the right side), but the present invention is not limited thereto. In other embodiments, the first conductive pillar 218a may be disposed on the right side of the channel material layer 120' connected by the first conductive pillar 218a, the third conductive pillar 218c may also be disposed on the right side of the channel material layer 120' connected by the third conductive pillar 218c, that is, the first conductive pillar 218a and the third conductive pillar 218c may be respectively disposed on the same side of the connected channel material layers 120' (for example, both are disposed on the right side).

Figure 11A:
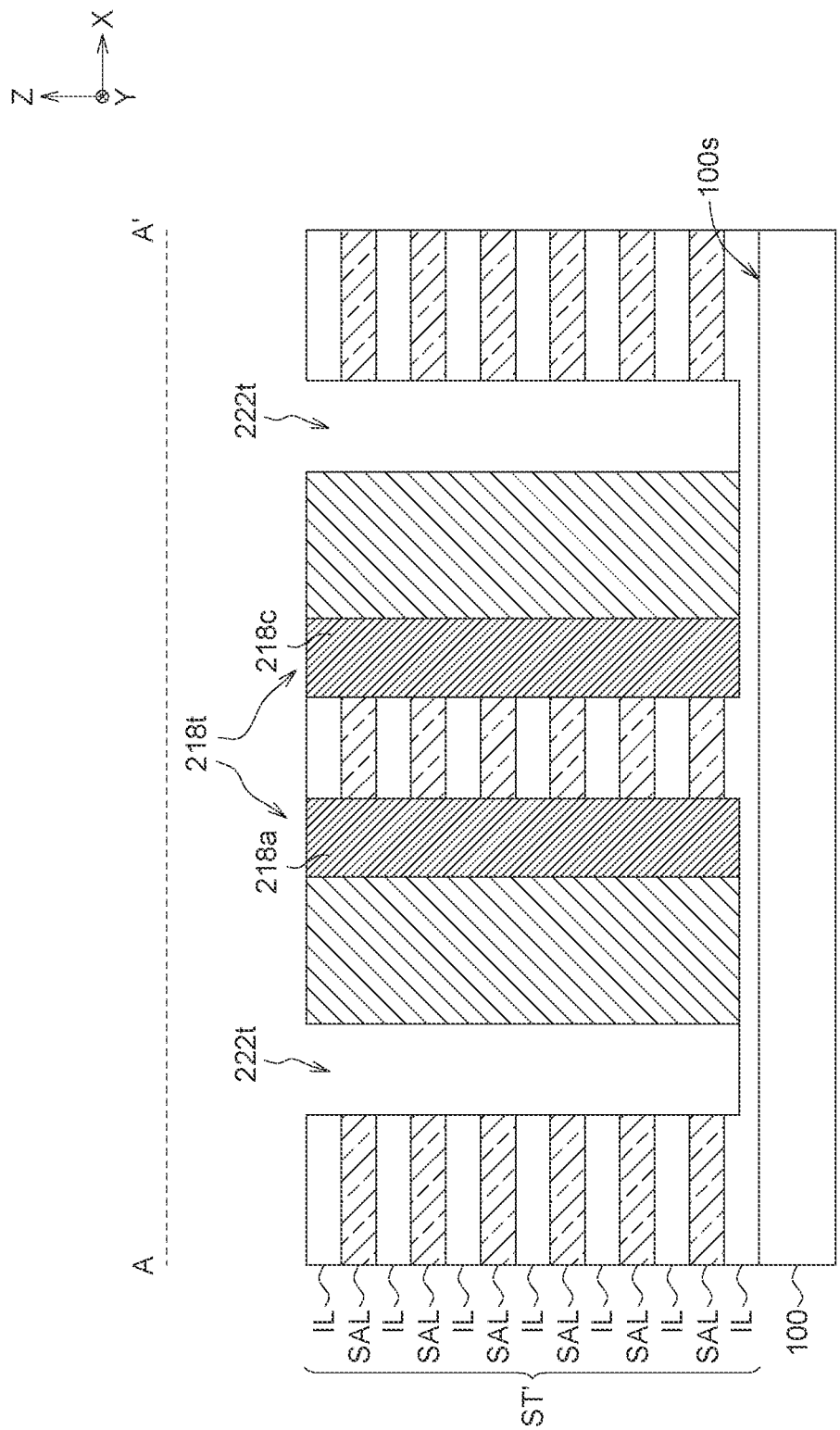
Figure 11B:
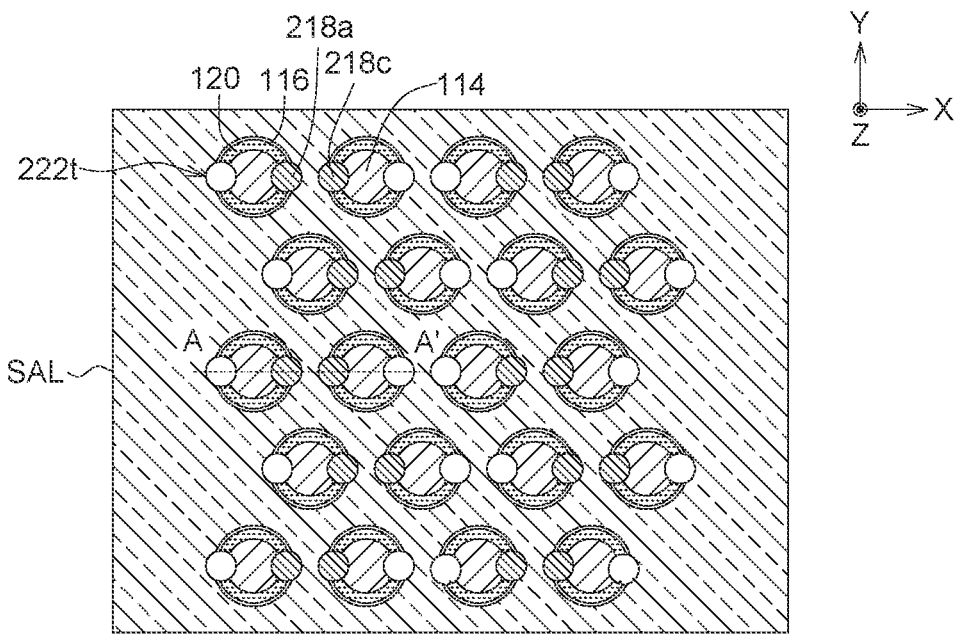
Figure 11C:
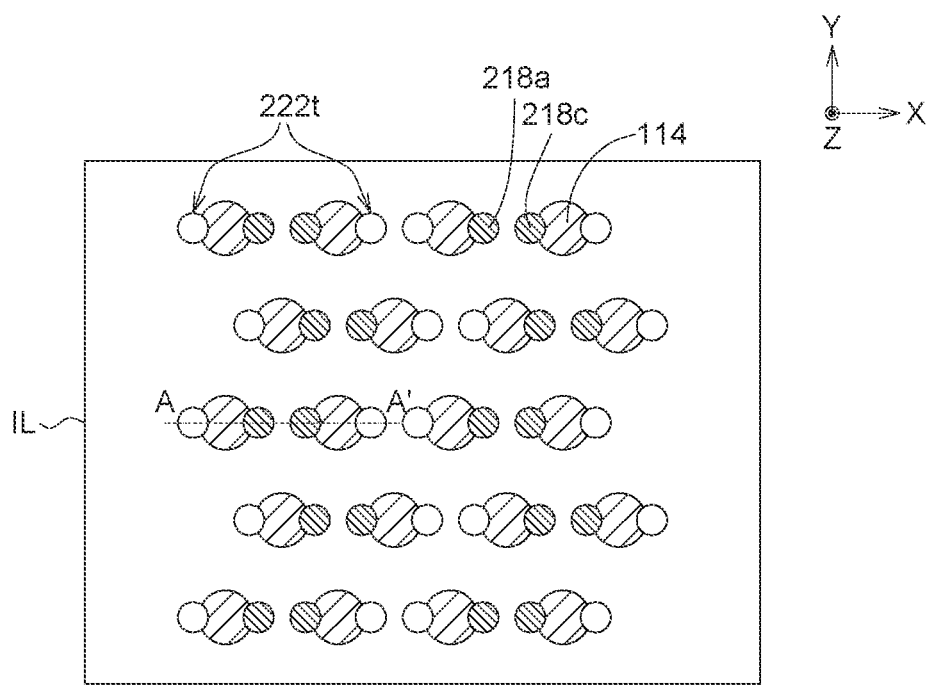

Please refer to FIGS. 11A-11C at the same time. FIG. 11A illustrates a cross-sectional view formed in a first direction (such as Z direction) and a third direction (such as X direction), corresponding to the cross-sectional view taken along lines A-A' in FIGS. 11B and 11C; FIG. 11B illustrates a top view formed in the second direction (such as Y direction) and the third direction (such as X direction), corresponding to the plane of the sacrificial layer SAL; FIG. 11C illustrates a top view formed in the second direction (such as Y direction) and the third direction (such as X direction), corresponding to the plane of the insulating layer IL.

As shown in FIGS. 11A to 11C, extension holes 222t extending along the first direction are formed on the second side E2 (such as the outer side) of the channel material layer 120'. The extension holes 222t are, for example, formed by an etching process to remove portions of the insulating pillars 114, the oxide material layers 116', the channel material layers 120', the insulating layers IL, and the sacrificial layers SAL (that is, removing portions of the stacked structure ST'). After the extension holes 222t are formed, the oxide material layers 116' and the channel material layers 120' become the oxide layers 116 and the channel layers 120, respectively.

Figure 12A:
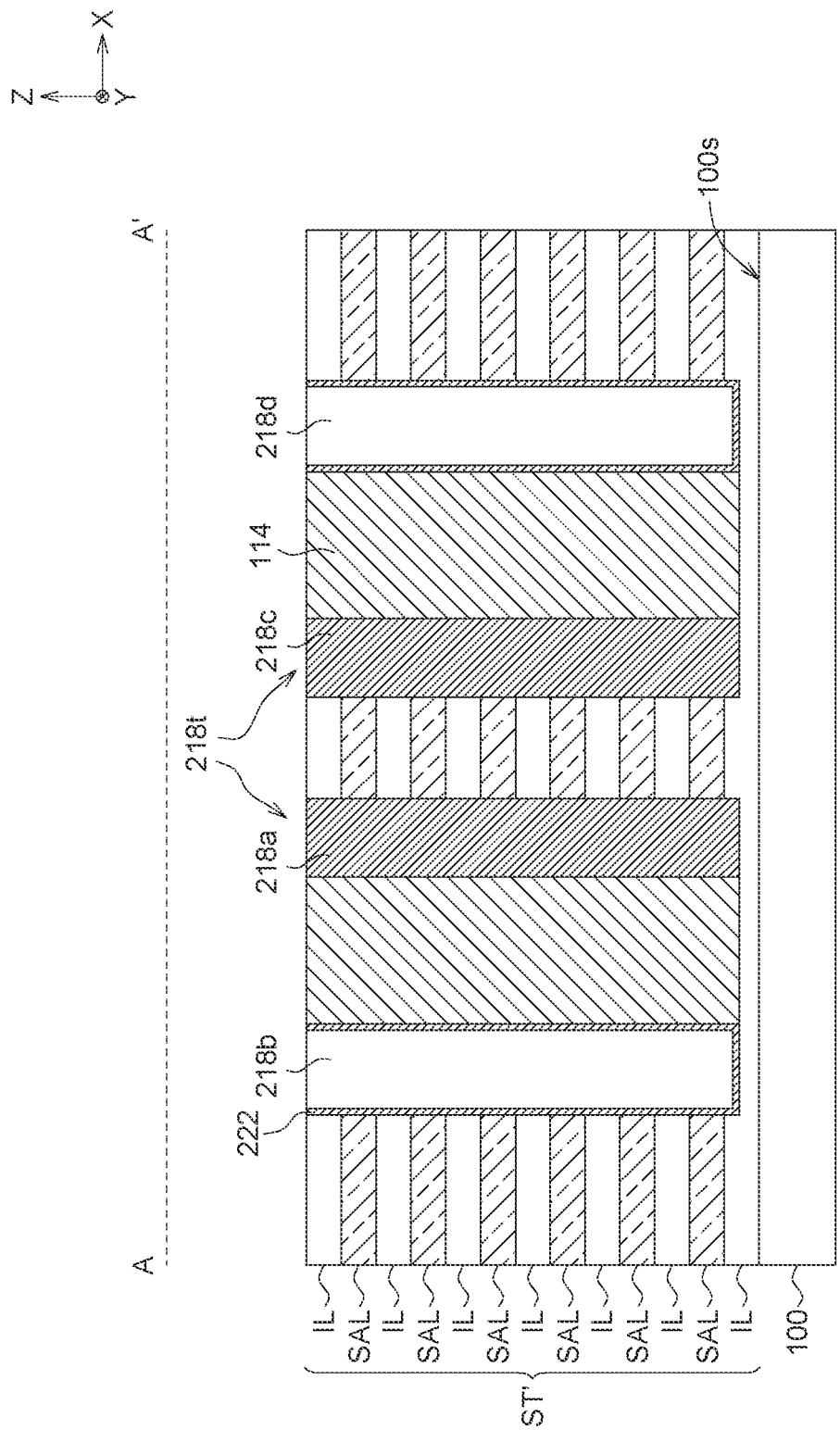
Figure 12B:
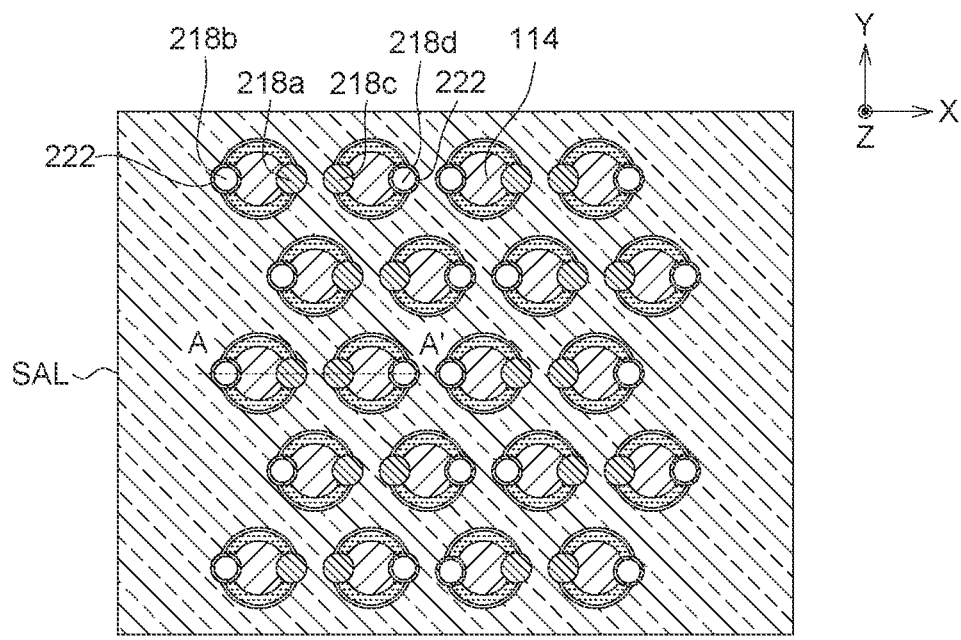
Figure 12C:
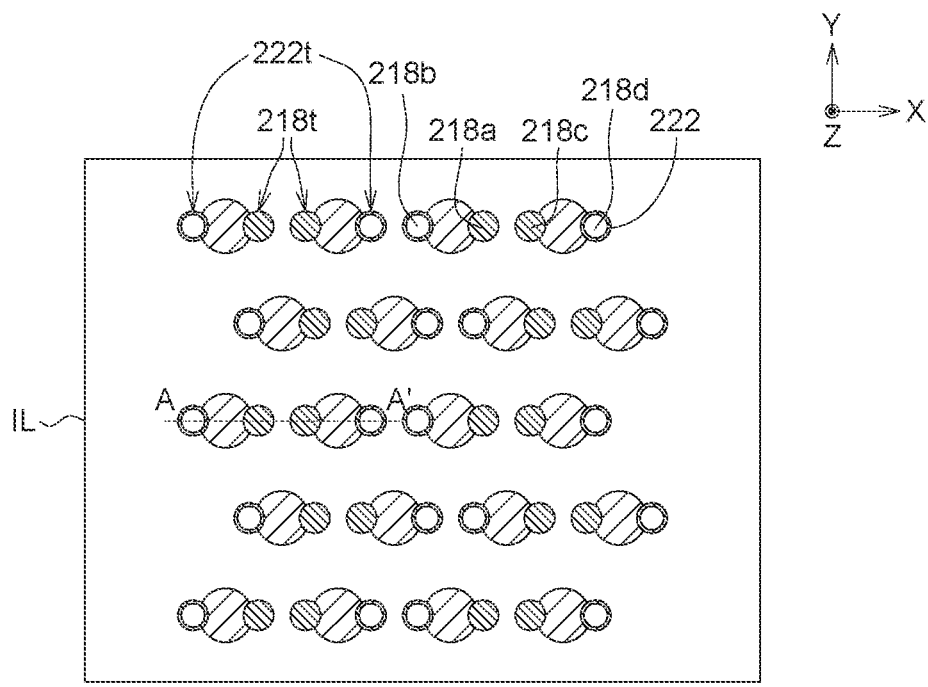

Hereafter, please refer to FIGS. 12A to 12C at the same time. FIG. 12A illustrates a cross-sectional view formed in the first direction (such as Z direction) and the third direction (such as X direction), corresponding to the cross-sectional view taken along lines A-A' in FIGS. 12B and 12C; FIG. 12B illustrates a top view formed in the second direction (such as Y direction) and the third direction (such as X direction), corresponding to the plane of the sacrificial layer SAL; FIG. 12C illustrates a top view formed in the second direction (such as Y direction) and the third direction (such as X direction), corresponding to the plane of the insulating layer IL.

As shown in FIGS. 12A to 12C, memory material and conductive material are sequentially filled in the extension holes 222t by a deposition process to form second conductive pillars 218b, fourth conductive pillars 218d, and the memory structures 222 surrounding the second conductive pillars 218b and the fourth conductive pillars 218d, respectively. Afterwards, a planarization process can be performed, for example, chemical mechanical planarization. The memory material may include resistive memory materials, such as transition metal oxides, conductive bridge memory materials, phase change memory materials, magnetoresistive memory materials, or other suitable materials. For example, the memory material may be hafnium oxide ($HfO_X$), germanium-antimony-tellurium alloy (Ge—Sb—Te alloy) or other suitable materials. The second conductive pillars 218b and the fourth conductive pillars 218d may have a multilayer structure, such as titanium nitride/tungsten (TiN/W), tantalum nitride/tungsten (TaN/W), titanium/titanium nitride/tungsten (Ti/TiN/W) or other suitable structure.

In the present embodiment, the cross-section of the memory structures 222 is a U-shaped structure, as shown in FIG. 12A, but the present invention is not limited thereto. In other embodiments, the memory structures 222 may be a ring structure, that is, the memory structures 222 only extend on the sidewalls of the extension holes 222t, and do not have a continuous bottom extending along the second direction and the third direction, and expose the bottom of the extension holes 222t.

Figure 13A:
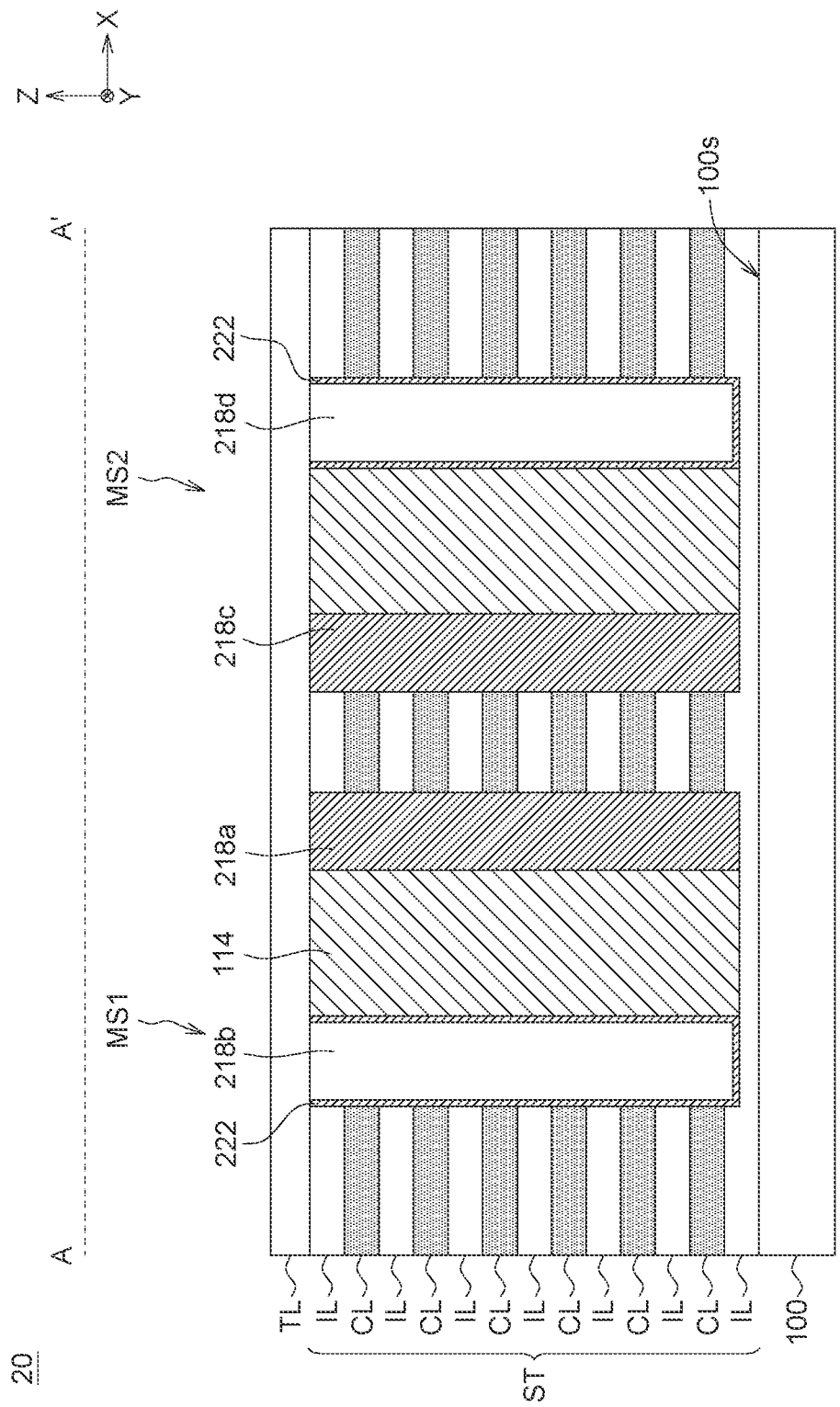
Figure 13B:
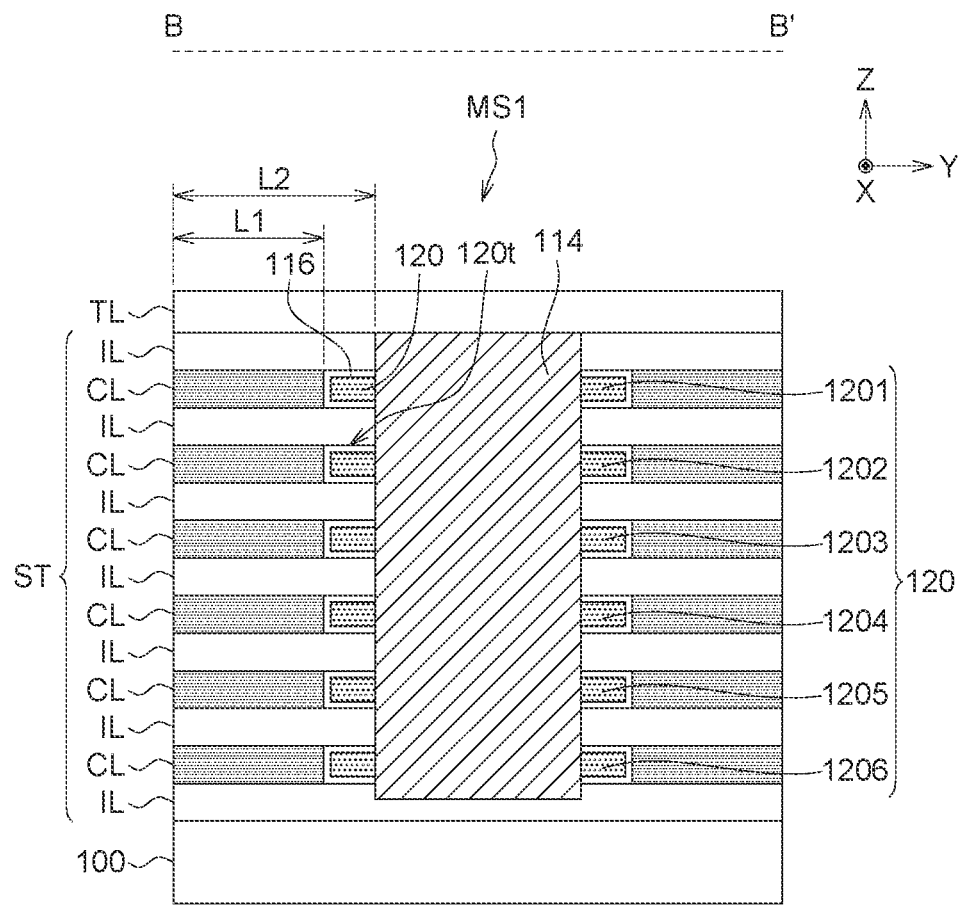
Figure 13C:
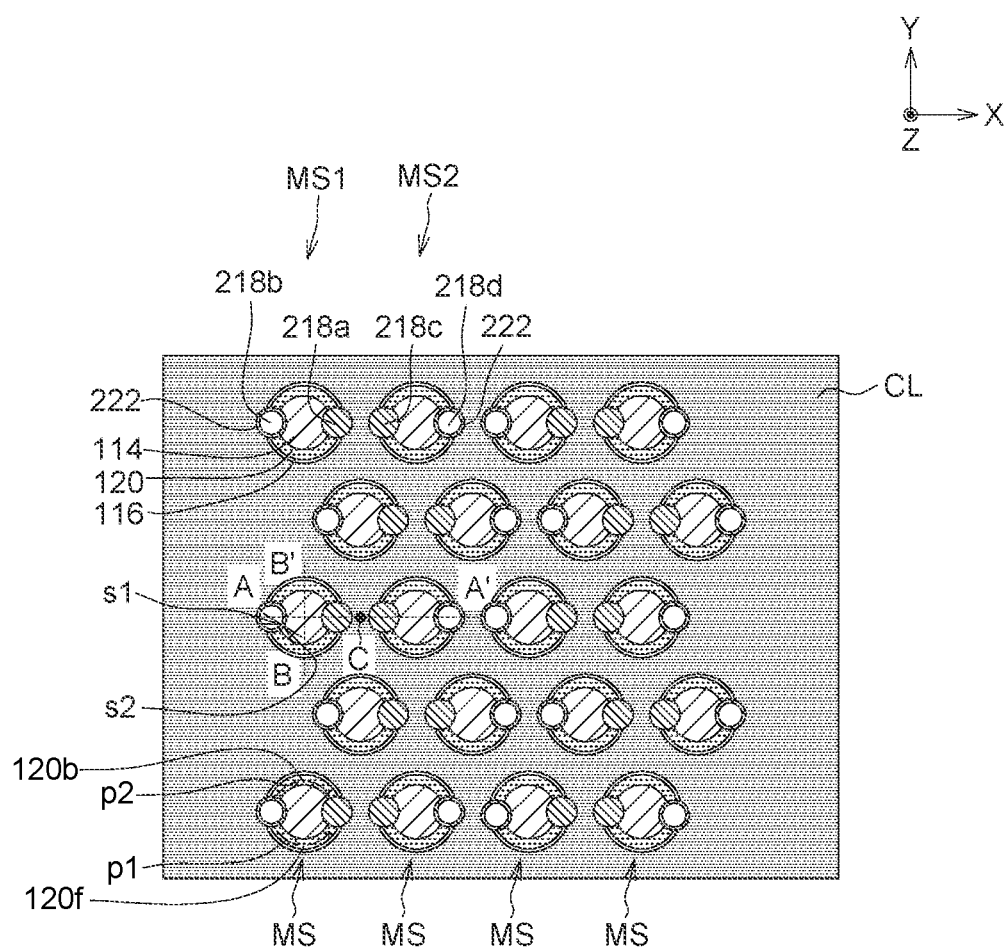
Figure 13D:
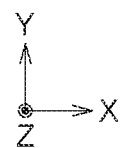
Figure 13D:

Hereafter, please refer to FIGS. 13A to 13D at the same time. FIG. 13A illustrates a cross-sectional view formed in the first direction (such as Z direction) and the third direction (such as X direction); FIG. 13B illustrates a cross-sectional view formed in the first direction (such as Z direction) and the second direction (such as Y direction); FIG. 13C illustrates a top view formed in the second direction (such as Y direction) and the third direction (such as X direction), corresponding to the plane of the conductive layer CL; FIG. 13D illustrates a top view formed by the second direction (such as Y direction) and the third direction (such as X direction), corresponding to the plane of the cover layer TL. FIGS. 13A and 13B respectively correspond to the cross-sections taken along line A-A' and line B-B' in FIG. 13C.

As shown in FIGS. 13A to 13D, after the sacrificial layers SAL are removed, a conductive material is filled at positions where the sacrificial layers SAL are removed, to form a plurality of conductive layers CL, that is, to form the stack ST formed by conductive layers CL and the insulating layers IL alternately stacked along the first direction. Thereafter, a cover layer TL is formed on the stack ST. For example, the sacrificial layers SAL may be removed by a selective etching process, and the insulating layers IL are remained. In this way, a plurality of memory strings MS passing through the stack ST are formed. The memory strings MS may include a first memory string MS1 and a second memory string MS2, wherein the first conductive pillar 218a, the second conductive pillar 218b, the channel layer 120 and the memory structure 222 may correspond to the first memory string MS1. In some embodiments, a barrier layer (not shown) may be deposited at positions where the sacrificial layers SAL are removed before filling the conductive material. The material of the barrier layer may be an oxide material or a dielectric material. The barrier layer may electrically isolate the conductive layers CL and the memory structure 222, and may serve as a gate oxide of the channel layer 120.

According to the above steps, a memory device 20 as shown in FIGS. 13A to 13D is formed. The memory device 20 includes a stack ST, a plurality of memory strings MS, and a cover layer TL disposed on a substrate 100. The stack ST includes a plurality of conductive layers CL and a plurality of insulating layers IL alternately stacked along the first direction. Wherein, the substrate 100 has an upper surface 100s, the stack ST is formed on the upper surface 100s, the conductive layers CL and the insulating layers IL respectively extend along the second direction and the third direction, the first direction, the second direction and the third direction are intersected with each other (the first direction, the second direction and the third direction are, for example, perpendicular to each other, but the present invention is not limited thereto). The memory strings MS pass through the stack ST along the first direction (such as Z direction). The cover layer TL is disposed on the stack ST.

Referring to FIG. 13C, two neighboring memory strings MS along the third direction (such as X direction) form a group of memory strings MS, and the two neighboring memory strings MS are separated from each other. Each group of memory strings MS may include a first memory string MS1 and a second memory string MS2. The first memory string MS1 includes a first conductive pillar 218a, a second conductive pillar 218b, an oxide layer 116, an insulating pillar 114, a channel layer 120, and a memory structure 222. The first conductive pillar 218a and the second conductive pillar 218b may respectively extend along the first direction and be separated from each other. The channel layer 120 is disposed between the first conductive pillar 218a and the second conductive pillar 218b. The oxide layers 116 are disposed between the conductive layers CL and the channel layer 120. The memory structure 222 surrounds the second conductive pillar 218b, and does not surround the channel layer 120, the oxide layers 116, and the first conductive pillar 218a (i.e. memory structure 222 exposing the channel layer 120, the oxide layers 116, and the first conductive pillar 218a). Furthermore, the memory structure 222 has an inner surface s1 and an outer surface s2. The inner surface s1 is opposite to the outer surface s2. The inner surface s1 directly contacts the second conductive pillar 218b, and the outer surface s2 directly contacts the channel layer 120, so that the second conductive pillar 218b and the channel layer 120 are separated by the memory structure 222. In other words, the memory structure 222 extends along the first direction (Z direction) and is disposed between the second conductive pillar 218b and the channel layer 120, between the second conductive pillar 218b and the insulating pillar 114, and between the second conductive pillar 218b and the stack ST (including the conductive layers CL and the insulating layers SL).

In the cross-section shown in FIG. 13C, the channel layer 120 is divided into a front channel layer 120f and a rear channel layer 120b by the first conductive pillar 218a and the second conductive pillar 218b. The front channel layer 120f and the rear channel layer 120b provide two current paths p1 and p2. In one embodiment, the first conductive pillar 218a can be used as the source of the first memory string MS1, the second conductive pillar 218b can be used as the drain of the first memory string MS1, and the bit line (not shown) is electrically connected to the second conductive pillar 218b, and the conductive layers CL can be used as word lines. When the current flows into the second conductive pillar 218b through the bit line (not shown), the current may flow into the memory structure 222 from the second conductive pillar 118b; thereafter, the current may be transmitted to the front channel layer 120f or/and the rear channel layer 120b, and then be transmitted to the first conductive pillar 218a from the front channel layer 120f or/and the rear channel layer 120b. That is, the current can flow through the path p1 or/and the path p2.

Referring to FIG. 13B, a length L1 of the conductive layers CL in the second direction (Y direction) is less than a length L2 of the insulating layers IL in the second direction (Y direction). In the present embodiment, a total length of the conductive layer CL, the oxide layer 116 and the channel layer 120 in the second direction is equal to a length of the insulating layer IL in the second direction. A plurality of grooves 120t are disposed between the conductive layers CL and the insulating layers IL, and the channel layer 120 is disposed in the grooves 120t. More specifically, each of the conductive layers CL corresponds to a groove 120t, and the channel layer 120 is disposed between the upper and lower neighboring insulating layers IL and the corresponding conductive layer CL. Furthermore, the channel layer 120 includes a plurality of channel portions 1201 to 1206, the channel portions 1201 to 1206 correspond to different layers of conductive layers CL, and the channel portions 1201 to 1206 are separated from each other. In the present embodiment, the channel portions 1201 to 1206 of different layers are respectively confined in the grooves 120t and are not connected to each other. However, the present invention is not limited thereto. In other embodiments, the channel layer may extend beyond the grooves, so that the channel portions of different layers can be connected to each other.

According to an embodiment of the present invention, the memory structures 222 include a resistive memory material. The resistive memory material is, for example, transition metal oxide, conductive bridge memory material, phase change memory material, magnetoresistive memory material, or other suitable materials. For example, the memory material can be Hafnium Oxide ($HfO_x$), germanium-antimony-tellurium alloy (Ge—Sb—Te alloy) or other suitable materials. The material of the oxide layers 116 is, for example, silicon oxide, a high dielectric constant material, or other suitable materials. The material of the first conductive pillar 218a may include doped polysilicon. The second conductive pillar 218b may have a multilayer structure, such as titanium nitride/tungsten (TiN/W), tantalum nitride/tungsten (TaN/W), titanium/titanium nitride/tungsten (Ti/TiN/W) or others suitable structure. The material of the channel layers 120 is, for example, doped polysilicon. The conductive layers CL are, for example, a double-layered structure of titanium nitride/tungsten (TiN/W). The material of the insulating layers IL may include oxide, such as silicon dioxide.

In the present embodiment, the second memory string MS2 is neighboring to the first memory string MS1 and is separated from the first memory string MS1, as shown in FIG. 13C. The second memory string MS2 includes a third conductive pillar 218c, a fourth conductive pillar 218d, an oxide layer 116, an insulating pillar 114, a channel layer 120, and a memory structure 122. There is a center point C between the first memory string MS1 and the second memory string MS2. The second memory string MS2 is mirror-symmetrical to the first memory string MS1 on a symmetry axis penetrating the center point C and extending along the second direction. The materials, structures and functions of the third conductive pillars 218c and the fourth conductive pillars 218d are the same as the materials, structures and functions of the first conductive pillars 218a and the second conductive pillars 218b, respectively. The third conductive pillar 218c can be used as the source of the second memory string MS2, and the fourth conductive pillar 218d can be used as the drain of the second memory string MS2. That is, after a current is applied to the fourth conductive pillar 218d, the current can be sequentially transmitted to the third conductive pillar 218c through the memory structure 222 and the channel layer 120 in sequence. The other elements in the second memory strings MS2 use the same reference numerals as the other elements in the first memory strings MS1, and these elements also have the same materials, structures and functions, and the description will not be repeated here.

In the present embodiment, the first conductive pillar 218a (for example, the source) is disposed on the right side of the first memory string MS1, and the second conductive pillar 218b (for example, the drain) and the memory structure 222 connected by the second conductive pillar 218b are disposed on the left side of the first memory string MS1, the third conductive pillar 218c (for example, the source) is disposed on the left side of the second memory string MS2; the fourth conductive pillar 218d (for example, the drain) and memory structure 222 connected by the fourth conductive pillar 218d are disposed on the right side of the memory string MS2, that is, the first conductive pillar 218a and the third conductive pillar 218c are respectively disposed on different sides (i.e. the left side and the right side) of the first memory string MS1 and the second memory string MS2, as shown in FIG. 13C, however, the present invention is not limited thereto. In other embodiments, the first conductive pillar 218a (for example, the source) may be disposed on the right side of the first memory string MS1, the second conductive pillar 218b (for example, the drain) and the memory structure 222 connected by the second conductive pillar 218b can be disposed on the left side of the first memory string MS1; the third conductive pillar 218c (for example, the source) can be disposed on the right side of the second memory string MS2; the fourth conductive pillar 218d (for example, drain) and the memory structure 222 connected by the fourth conductive pillar 218d can be disposed on the left side of the second memory string MS2, that is, the first conductive pillar 218a and the third conductive pillar 218c can be respectively disposed on the same side (for example, both are on the right side) of the first memory string MS1 and the second memory string MS2; the second conductive pillar 218b, the fourth conductive pillar 218d and the connected memory structures 222 can be respectively disposed on the same side (for example, both are on the left side) of the first memory string MS1 and the second memory string MS2, and such a structure may correspond to the circuit diagram of the memory device 30 shown in FIG. 14C.

In the present embodiment, the first conductive pillar 218a, the second conductive pillar 218b, the third conductive pillar 218c, and the fourth conductive pillar 218d may have a circular cross section, as shown in FIG. 13C, but the present invention is not limited thereto, the cross-sections of the first conductive pillar 218a, the second conductive pillar 218b, the third conductive pillar 218c, and the fourth conductive pillar 218d may be elliptical or other suitable shapes, and one of ordinary skill in the art can adjust according to the requirements.

Compared with the comparative example in which the memory structure surrounds the channel layer, since the memory structure 222 in the present application only surrounds the second conductive pillar 218b or the fourth conductive pillar 218d and does not surround the channel layer 120, the contact area between the memory structure 222 and the channel layer 120 is smaller. Moreover, compared with the comparative example in which the channel layer is not formed in the groove or the channel layer continuously extends along the first direction, since the channel layer 120 of the present application is formed in the grooves 120t and the channel portions 1201 to 1206 corresponding to different conductive layers CL are not connected to each other, so the contact area between the memory structure 222 and the channel layer 120 is smaller. That is, in the memory device 20 according to one embodiment of the present invention, the memory structure 222 and the channel layer 120 can have a smaller contact area, so that the risk of leakage current can be greatly reduced, and the operating voltage can be reduced.

Figure 14A:
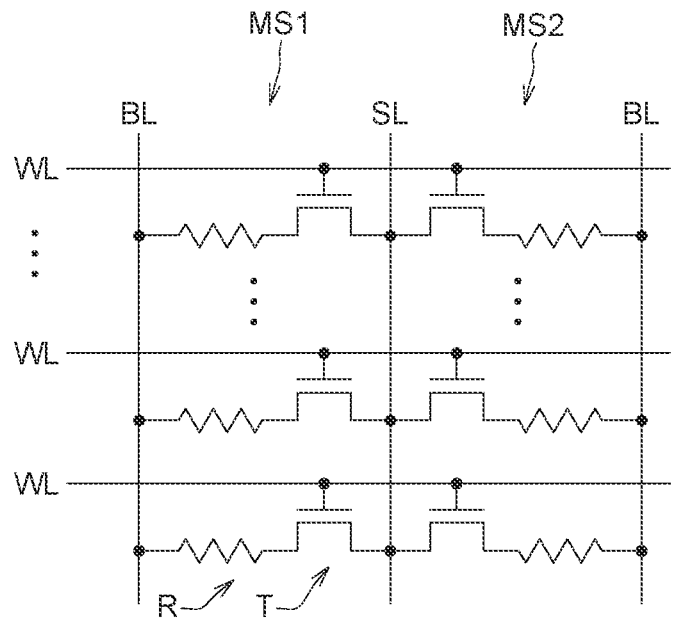
FIG. 14A is a circuit diagram of a memory device according to an embodiment of the invention.
Figure 14B:
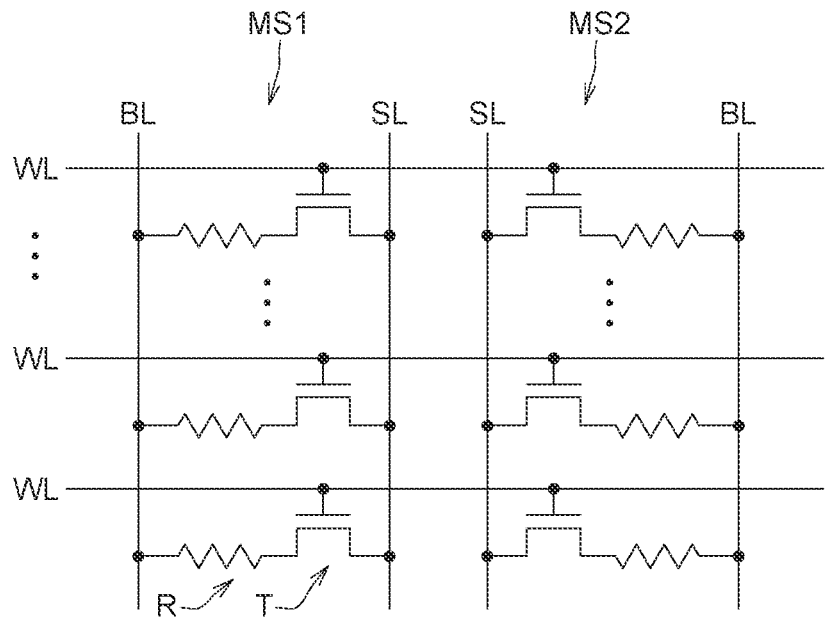
FIG. 14B is a circuit diagram of a memory device according to another embodiment of the present invention.
Figure 14C:
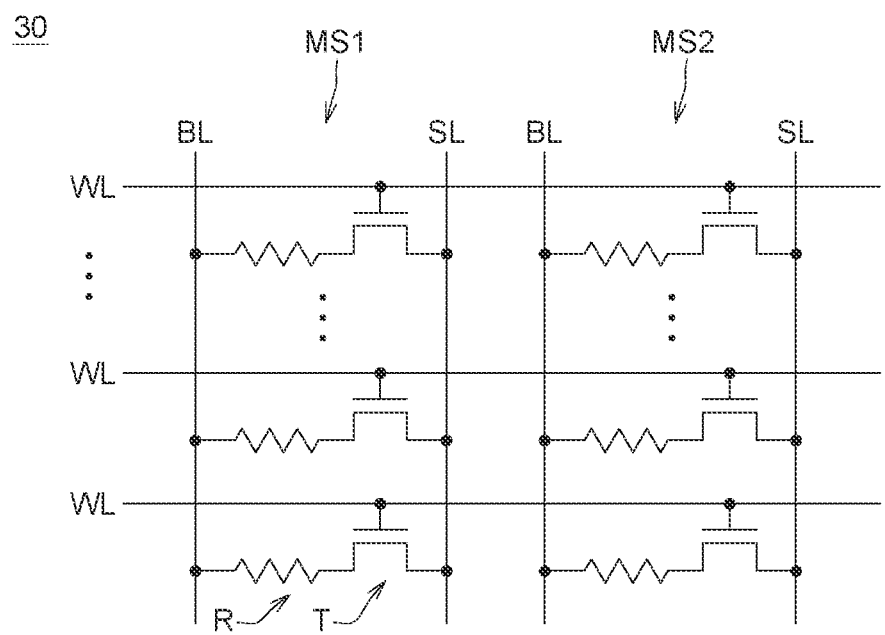
FIG. 14C is a circuit diagram of a memory device according to further embodiment of the present invention.

FIG. 14A is a circuit diagram of a memory device 10 (that is, the memory device 10 shown in FIGS. 9A to 9D) according to an embodiment of the present invention. FIG. 14B is a circuit diagram of a memory device 20 (that is, the memory device 10 shown in FIGS. 13A to 13D) according to another embodiment of the present invention. FIG. 14C is a circuit diagram of the memory device 30 according to an embodiment of the present invention.

Please refer to FIG. 14A, the conductive layers CL are word lines WL, the first conductive pillar 118a is electrically connected to the source line SL, and the second conductive pillar 118b and the third conductive pillar 118c are electrically connected to the bit lines BL, respectively, wherein the memory structures 122 surround the second conductive pillar 118b and the third conductive pillar 118c, respectively. The resistive random-access memories (RRAM) R and the transistors T are electrically connected to the corresponding word line WL, the bit line BL, and the source line SL. That is, each of the intersections between the memory structures 122 and the conductive layers CL may form a memory cell unit including one resistive random-access memory and one transistor (1T1R). In the present embodiment, the memory device 10 is a common-source AND memory array structure, the first memory string MS1 and the second memory string MS2 share one source line SL.

Please refer to FIG. 14B, the conductive layers CL are word lines WL, the first conductive pillar 218a is electrically connected to the source line SL, the second conductive pillar 218b is electrically connected to the bit line BL, and the third conductive pillar 218c is electrically connected to the source line SL, and the fourth conductive pillar 218d is electrically connected to the bit line. The memory structures 222 surround the second conductive pillar 218b and the fourth conductive pillar 218d, respectively. The resistive random-access memory R and the transistor T are electrically connected to the corresponding word line WL, bit line BL, and source line SL. That is, each of the intersections between the memory structures 222 and the conductive layers CL may form a memory cell unit including one resistive random-access memory R and one transistor T (1T1R). In the present embodiment, the memory device 20 is a AND memory array structure.

The memory device 30 shown in FIG. 14C is similar to the memory device 20, the difference is in the positions where the third conductive pillars, the fourth conductive pillars and the connected memory structures in the second memory string are disposed. Please refer to FIG. 14C, the conductive layers are word lines WL, the first conductive pillar is electrically connected to the source line SL, the second conductive pillar is electrically connected to the bit line BL, and the third conductive pillar is electrically connected to the source line SL, and the fourth conductive pillar is electrically connected to the bit line BL, wherein the first conductive pillar is disposed between the second conductive pillar and the fourth conductive pillar, and the fourth conductive pillar is disposed between the first conductive pillar and the third conductive pillar, and the memory structures respectively surround the second conductive pillar and the fourth conductive pillar. The resistive random-access memory and the transistor are electrically connected to the corresponding word line WL, bit line BL, and source line SL. That is, each of the intersections between the memory structures and the conductive layers may form a memory cell unit including one resistive random-access memory R and one transistor T (1T1R). In the present embodiment, the memory device 30 is an AND memory array structure.

According to one embodiment, the present invention provides a memory device and a method for manufacturing the same. The memory device includes a stack and a plurality of memory strings. The stack is disposed on the substrate, and the stack includes a plurality of conductive layers and a plurality of insulating layers alternately stacked. The memory strings pass through the stack along a first direction, wherein a first memory string in the memory strings includes a first conductive pillar and a second conductive pillar, a channel layer, and a memory structure. The first conductive pillar and the second conductive pillar respectively extend along the first direction and are separated from each other. The channel layer is disposed between the first conductive pillar and the second conductive pillar. The memory structure surrounds the second conductive pillar, and the memory structure includes a resistive memory material.

Compared with the comparative example in which the memory structure surrounds the channel layer, since the memory structure of the present application only surrounds the second conductive pillar (i.e. not surrounding the channel layer), the contact area between the memory structure and the channel layer is smaller, thereby dramatically reducing the risk of current leakage, and the operating voltage can be reduced. Therefore, some conventional electrical problems can be overcome.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a stack disposed on a substrate, the stack comprising a plurality of conductive layers and a plurality of insulating layers alternately stacked; and
   a plurality of memory strings passing through the stack along a first direction, wherein a first memory string in the memory strings comprises:
   a first conductive pillar and a second conductive pillar respectively extending along the first direction and separated from each other;
   a channel layer disposed between the first conductive pillar and the second conductive pillar; and
   a memory structure surrounding the second conductive pillar, wherein the memory structure comprises a resistive memory material.

2. The memory device according to claim 1, wherein the memory structure is disposed between the second conductive pillar and the channel layer.

3. The memory device according to claim 1, wherein the memory structure has an inner surface and an outer surface, the inner surface is opposite to the outer surface, the inner surface directly contacts the second conductive pillar, and the outer surface directly contacts the channel layer, so that the second conductive pillar and the channel layer are separated by the memory structure.

4. The memory device according to claim 1, wherein the substrate has an upper surface, the stack is formed on the upper surface, and the conductive layers and the insulating layers respectively extend along a second direction, the second direction is intersected with the first direction, and a length of the conductive layers in the second direction is smaller than a length of the insulating layers in the second direction.

5. The memory device according to claim 1, further comprising a plurality of grooves disposed between the conductive layers and the insulating layers, wherein the channel layer is disposed in the grooves.

6. The memory device according to claim 1, wherein the channel layer comprises a plurality of channel portions, the channel portions correspond to the conductive layers of different layers, and the channel portions are separated from each other.

7. The memory device according to claim 1, further comprising a plurality of oxide layers, and the oxide layers are disposed between the conductive layers and the channel layer.

8. The memory device according to claim 1, wherein the memory strings further comprises a second memory string, the second memory string is neighboring to the first memory string, and the first memory string and the second memory string share the first conductive pillar.

9. The memory device according to claim 1, wherein the memory strings further comprises a second memory string, and the second memory string is neighboring to the first memory string and is separated from the first memory string.

10. The memory device according to claim 1, wherein the resistive memory material is a transition metal oxide, a conductive bridge memory material, a phase change memory material, or a magnetoresistive memory material.

\* \* \* \* \*